US012628515B2

(12) United States Patent
Shu et al.

(10) Patent No.: US 12,628,515 B2
(45) Date of Patent: May 12, 2026

(54) DISPLAY PANEL AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Xiaoqing Shu, Beijing (CN); Biao Liu, Beijing (CN); Jiangtao Deng, Beijing (CN); Huijuan Yang, Beijing (CN); Yi Zhang, Beijing (CN); Tingliang Liu, Beijing (CN); Maoying Liao, Beijing (CN); Lingtong Li, Beijing (CN); Liheng Wei, Beijing (CN); Yao Huang, Beijing (CN); Jianchang Cai, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 402 days.

(21) Appl. No.: 18/034,396

(22) PCT Filed: May 9, 2022

(86) PCT No.: PCT/CN2022/091754
§ 371 (c)(1),
(2) Date: Apr. 28, 2023

(87) PCT Pub. No.: WO2023/165016
PCT Pub. Date: Sep. 7, 2023

(65) Prior Publication Data
US 2024/0324334 A1 Sep. 26, 2024

(30) Foreign Application Priority Data
Mar. 1, 2022 (WO) ................ PCT/CN2022/078680

(51) Int. Cl.
*H10K 59/131* (2023.01)
*H10K 59/12* (2023.01)
(Continued)

(52) U.S. Cl.
CPC ....... *H10K 59/131* (2023.02); *H10K 59/1201* (2023.02); *H10K 59/121* (2023.02);
(Continued)

(58) Field of Classification Search
None
See application file for complete search history.

(56) References Cited

U.S. PATENT DOCUMENTS

2018/0069068 A1* 3/2018 Ka ........................ H10D 86/60
2020/0350377 A1* 11/2020 Zhong ................. H04M 1/0264
(Continued)

FOREIGN PATENT DOCUMENTS

CN 111446282 A 7/2020
CN 111477676 A 7/2020
(Continued)

OTHER PUBLICATIONS

International Search Report for PCT/CN2022/078680 Mailed Jul. 15, 2022.
(Continued)

*Primary Examiner* — Bilkis Jahan
(74) *Attorney, Agent, or Firm* — Ling Wu; Stephen Yang; Ling and Yang Intellectual Property

(57) ABSTRACT
A display panel includes a base substrate, a circuit structure layer, a light emitting structure layer, and multiple conductive layers. The conductive layer is located between the circuit structure layer and the light emitting structure layer and includes multiple conductive lines. At least one second pixel drive circuit of the multiple second pixel drive circuits is electrically connected to at least one second light emitting
(Continued)

device of the second light emitting devices through a conductive line, and the at least one second pixel drive circuit is configured to drive the at least one second light emitting device to emit light. There is an overlap between orthographic projections of the portions of conductive lines of at least two of the multiple conductive layers extending in the first direction on the base substrate.

17 Claims, 22 Drawing Sheets

(51) Int. Cl.
| | |
|---|---|
| *H10K 59/121* | (2023.01) |
| *H10K 59/35* | (2023.01) |
| *H10K 59/65* | (2023.01) |

(52) U.S. Cl.
CPC ......... *H10K 59/351* (2023.02); *H10K 59/353* (2023.02); *H10K 59/65* (2023.02)

(56) References Cited

U.S. PATENT DOCUMENTS

| | | | |
|---|---|---|---|
| 2021/0333968 A1 | 10/2021 | Wu et al. | |
| 2021/0335920 A1 | 10/2021 | Hong et al. | |
| 2022/0013598 A1 | 1/2022 | Park et al. | |
| 2022/0077276 A1* | 3/2022 | Wang | H10K 59/121 |
| 2022/0115573 A1* | 4/2022 | Huang | H01L 25/167 |
| 2022/0310742 A1 | 9/2022 | Yi et al. | |
| 2022/0320146 A1 | 10/2022 | Huang et al. | |
| 2022/0376028 A1 | 11/2022 | Huang et al. | |
| 2023/0045968 A1 | 2/2023 | Wu et al. | |

FOREIGN PATENT DOCUMENTS

| | | |
|---|---|---|
| CN | 111916486 A | 11/2020 |
| CN | 112038381 A | 12/2020 |
| CN | 112271205 A | 1/2021 |
| CN | 112670302 A | 4/2021 |
| CN | 113178537 A | 7/2021 |
| CN | 113764462 A | 12/2021 |
| CN | 113838888 A | 12/2021 |
| CN | 114141851 A | 3/2022 |
| CN | 114639328 A | 6/2022 |
| JP | 2001102362 A | 4/2001 |

OTHER PUBLICATIONS

International Search Report for PCT/CN2022/091754 Mailed Dec. 5, 2022.
European Search Report for 22929453.3 Mailed Sep. 13, 2024.

* cited by examiner

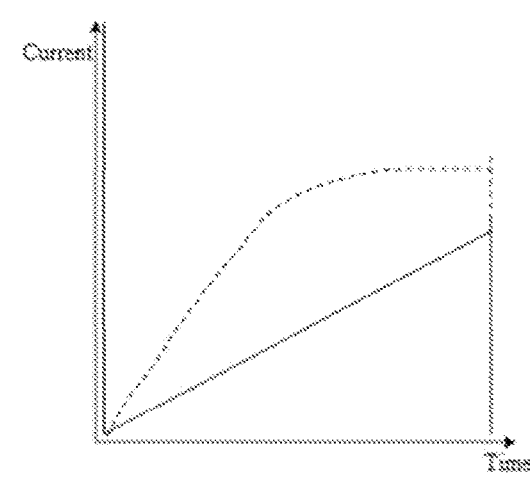
FIG. 5
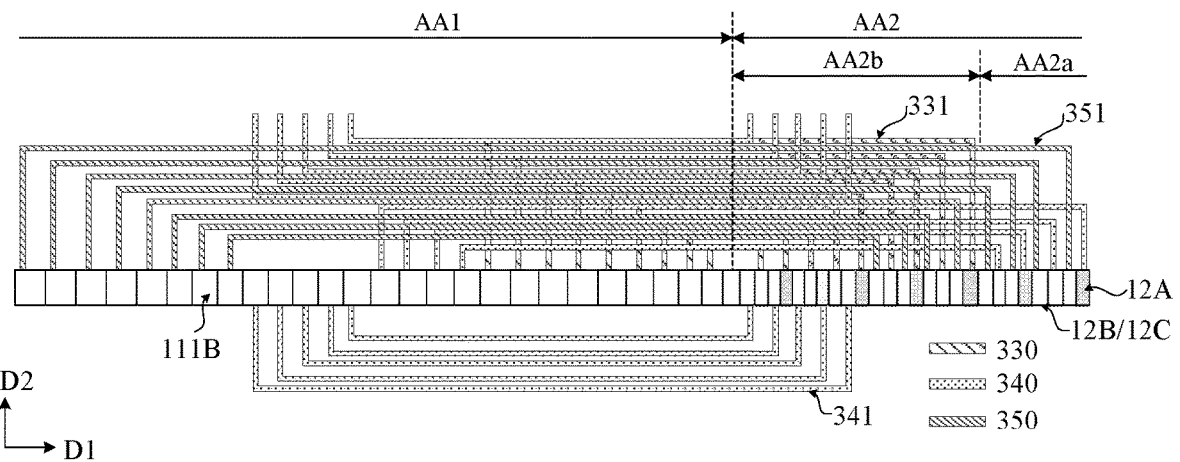
FIG. 6A
FIG. 6B

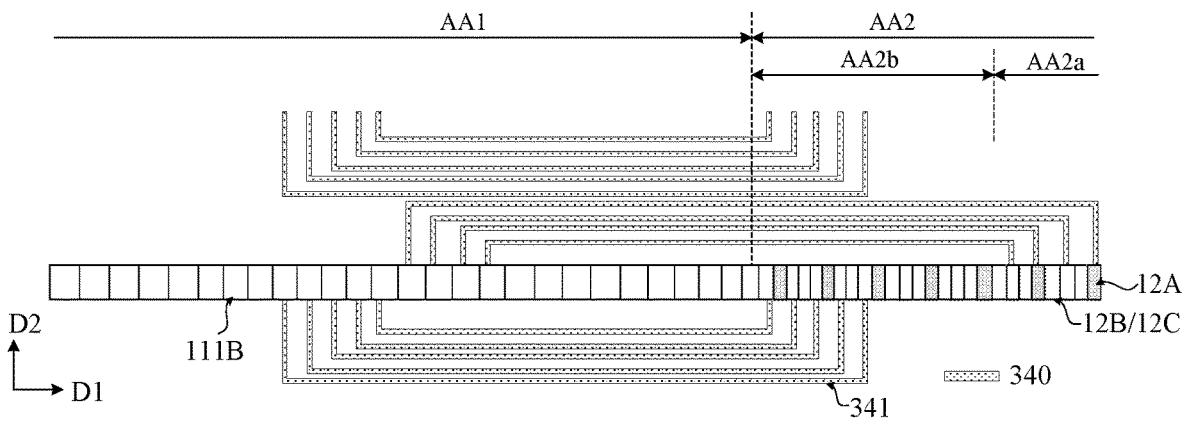
FIG. 6C
FIG. 6D
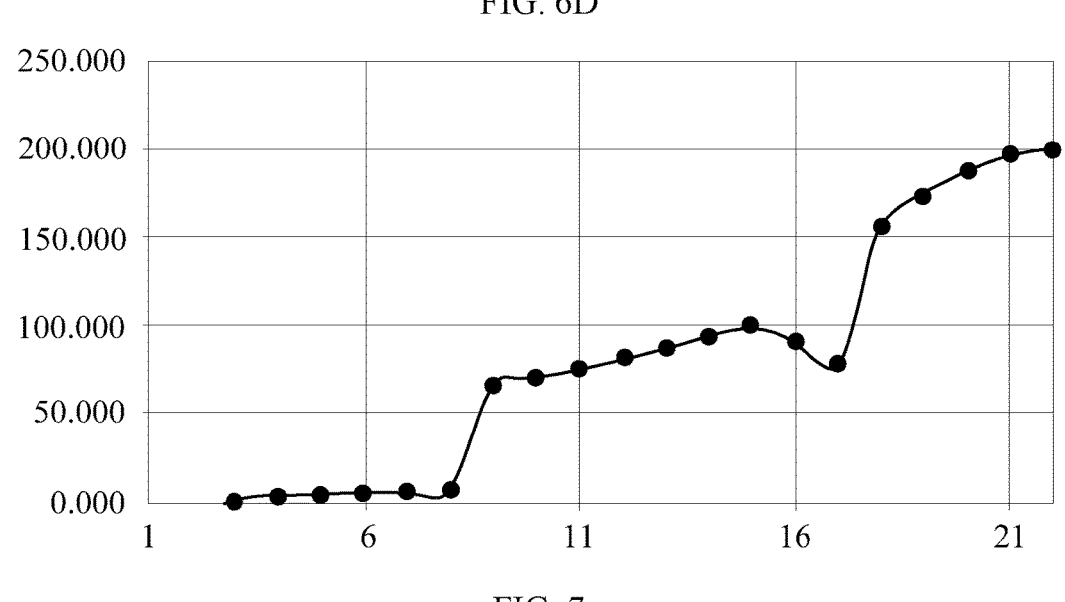
FIG. 7

DISPLAY PANEL AND DISPLAY DEVICE

CROSS-REFERENCE TO RELATED APPLICATIONS

The present application is a U.S. National Phase Entry of International Application PCT/CN2022/091754, having an international filing date of May 9, 2022, and entitled "Display Panel and Display Device", which claims priority of International Application No. PCT/CN2022/078680 filed on Mar. 1, 2022, the contents of the above-identified applications shall be construed as being incorporated herein by reference.

TECHNICAL FIELD

The present disclosure relates to, but is not limited to, the field of display technology, in particular to a display panel and a display device.

BACKGROUND

An Organic Light Emitting Diode (OLED) and a Quantum dot Light Emitting Diode (QLED) are active light emitting display devices and have advantages of self-luminescence, a wide viewing angle, a high contrast ratio, low power consumption, very high reaction speed, lightness and thinness, bendability, and low cost. An under screen camera technology is a brand-new technology proposed for increasing a screen-to-body ratio of a display device.

SUMMARY

The following is a summary of subject matter described herein in detail. The summary is not intended to limit the protection scope of claims.

An embodiment of the present disclosure provides a display panel and a display device.

In one aspect, an embodiment of the present disclosure provides a display panel having a display area, the display area includes: a first region and a second region which are not overlapped each other, the first region is located on at least one side of the second region; the display panel includes a base substrate, a circuit structure layer, a light emitting structure layer and multiple conductive layers. The circuit structure layer is located on a side of the base substrate and includes multiple second pixel drive circuits located in the first region. The light emitting structure layer is located on a side of the circuit structure layer away from the base substrate and includes multiple second light emitting devices located in a second region. Multiple conductive layers are located between the circuit structure layer and the light emitting structure layer, and include multiple conductive lines. At least one second pixel drive circuit of the multiple second pixel drive circuits is electrically connected to at least one second light emitting device of the multiple second light emitting devices through a conductive line of at least one conductive layer of the multiple conductive layers, the at least one second pixel drive circuit is configured to drive the at least one second light emitting device to emit light. There is an overlap between orthographic projections of portions of conductive lines of at least two of the multiple conductive layers extending in the first direction on the base substrate.

In some exemplary embodiments, the multiple second light emitting devices in the second region include: multiple first type second light emitting devices and multiple second type second light emitting devices, the first type second light emitting devices are configured to emit light of a first color and the second type second light emitting devices are configured to emit light of a second color, wherein the second color is different from the first color.

In some exemplary embodiments, the multiple second light emitting devices in the second region includes multiple sets of second light emitting devices, second light emitting devices in each of the multiple sets of second light emitting devices are arranged along the first direction, the multiple sets of second light emitting devices are arranged along the second direction, wherein the second direction intersects with the first direction. In the at least one set of second light emitting devices, multiple second pixel drive circuits electrically connected to the multiple first type second light emitting devices are closer to the second region than each of the multiple second pixel drive circuits electrically connected to the multiple second type second light emitting devices.

In some exemplary embodiments, the multiple conductive layers include: a first transparent conductive layer, a second transparent conductive layer, and a third transparent conductive layer arranged in sequence along a side away from the base substrate. The first transparent conductive layer includes multiple first transparent conductive lines, the second transparent conductive layer includes multiple second transparent conductive lines, and the third transparent conductive layer includes multiple third transparent conductive lines. There is an overlap between an orthographic projection of a portion of a first transparent conductive line of the first transparent conductive layer extending in the first direction on the base substrate and an orthographic projection of a portion of a second transparent conductive line of the second transparent conductive layer extending in the first direction on the base substrate. There is no overlap between an orthographic projection of a portion of a third transparent conductive line of the third transparent conductive layer extending in the first direction on the base substrate and an orthographic projection of a portion of a first transparent conductive line of the first transparent conductive layer and a portion of a second transparent conductive line of the second transparent conductive layer extending in the first direction on the base substrate.

In some exemplary embodiments, in at least one set of second light emitting devices in the second region, multiple first type second light emitting devices near an edge of the second region are electrically connected to multiple second pixel drive circuits of the first region through a second transparent conductive line of the second transparent conductive layer, multiple first type second light emitting devices near a center of the second region are electrically connected to multiple second pixel drive circuits of the first region through a first transparent conductive line of the first transparent conductive layer.

In some exemplary embodiments, in the at least one set of second light emitting devices in the second region, the second transparent conductive line and the first transparent conductive line to which the multiple first type second light emitting devices are electrically connected are located on opposite sides or on a same side of the set of second light emitting devices in the second direction.

In some exemplary embodiments, in at least one set of second light emitting devices in the second region, multiple second type second light emitting devices near an edge of the second region are electrically connected to multiple second pixel drive circuits of the first region through a second transparent conductive line of the second transparent conductive layer, multiple second type second light emitting devices near the center of the second region are electrically connected to multiple second pixel drive circuits of the first region through a third transparent conductive line of the third transparent conductive layer.

In some exemplary embodiments, in the at least one set of second light emitting devices in the second region, the second transparent conductive line and the third transparent conductive line to which the multiple second type second light emitting devices are electrically connected are located on opposite sides or on a same side of the set of second light emitting devices in the second direction.

In some exemplary embodiments, in the at least one set of second light emitting devices in the second region, the second transparent conductive line electrically connected to the first type second light emitting devices and the second transparent conductive line electrically connected to the second type second light emitting devices are located on opposite sides of the set of second light emitting devices in the second direction.

In some exemplary embodiments, in the at least one set of second light emitting devices in the second region, a first transparent conductive line electrically connected to the first type second light emitting devices and a third transparent conductive line electrically connected to the second type second light emitting devices are located on a same side of the set of second light emitting devices in the second direction.

In some exemplary embodiments, in at least one set of second light emitting devices in the second region, multiple first type second light emitting devices near an edge of the second region are electrically connected to multiple second pixel drive circuits of the first region through a first transparent conductive line of the first transparent conductive layer, multiple first type second light emitting devices near a center of the second region are electrically connected to multiple second pixel drive circuits of the first region through a second transparent conductive line of the second transparent conductive layer. The first transparent conductive line and the second transparent conductive line electrically connected to the first type second light emitting devices are located on a same side of the set of second light emitting devices in the second direction.

In some exemplary embodiments, in the at least one set of second light emitting devices in the second region, multiple second type second light emitting devices near an edge of the second region are electrically connected to multiple second pixel drive circuits of the first region through a second transparent conductive line of the second transparent conductive layer, multiple second type second light emitting devices near the center of the second region are electrically connected to multiple second pixel drive circuits of the first region through a third transparent conductive line of the third transparent conductive layer. The second transparent conductive line electrically connected to the second type second light emitting device and the second transparent conductive line electrically connected to the first type second light emitting devices are located on opposite sides of the set of second light emitting devices in the second direction.

In some exemplary embodiments, the second region is divided into a first sub-region and a second sub-region, the second sub-region surrounds the first sub-region and is adjacent to the first region. A parasitic capacitance between an anode connection node of at least one first type second light emitting device and an anode connection node of a second type second light emitting device located in the first sub-region is less than or equal to a maximum parasitic capacitance between an anode connection node of a first type second light emitting device and an anode connection node of a second type second light emitting device located in the second sub-region.

In some exemplary embodiments, the light of the first color is green light and the light of the second color includes at least one of: blue light, red light.

In some exemplary embodiments, the circuit structure layer further includes: multiple first pixel drive circuits located in the first region, and the light emitting structure layer further includes: multiple first light emitting devices located in the first region. At least one first pixel drive circuit of the multiple first pixel drive circuits is electrically connected to at least one first light emitting device of the multiple first light emitting devices, and the at least one first pixel drive circuit is configured to drive the at least one first light emitting device to emit light.

In another aspect, an embodiment of the present disclosure provides a display device, which includes the aforementioned display panel.

In some exemplary embodiments, the display device further includes: a sensor located on a non-display side of the display panel, and an orthographic projection of the sensor on the display panel overlaps with the second region of the display panel.

Other aspects may be understood upon reading and understanding the drawings and the detailed description.

BRIEF DESCRIPTION OF DRAWINGS

Accompanying drawings are used for providing further understanding of technical solutions of the present disclosure, constitute a part of the specification, and are used for explaining the technical solutions of the present disclosure together with the embodiments of the present disclosure, but not to constitute limitations on the technical solutions of the present disclosure. Shapes and sizes of one or more components in the drawings do not reflect actual scales, and are only intended to schematically describe contents of the present disclosure.

FIG. 5 is a schematic simulation diagram of influence of light emitting devices emitting blue light on light emitting devices emitting green light.

FIG. 6A is a schematic diagram of connection between a second light emitting device and a second pixel drive circuit according to at least one embodiment of the present disclosure.

FIG. 6B is a schematic diagram of connection of a first transparent conductive line of a first transparent conductive layer in FIG. 6A.

FIG. 6C is a schematic diagram of connection of a second transparent conductive line of a second transparent conductive layer in FIG. 6A.

FIG. 6D is a schematic diagram of connection of a third transparent conductive line of the third transparent conductive layer in FIG. 6A.

FIG. 7 is a schematic diagram of a parasitic capacitance between an anode connection node of a second light emitting device emitting green light and an anode connection node of a second light emitting device emitting blue light or red light of a display panel shown in FIG. 6A.

DETAILED DESCRIPTION

Figure 1:
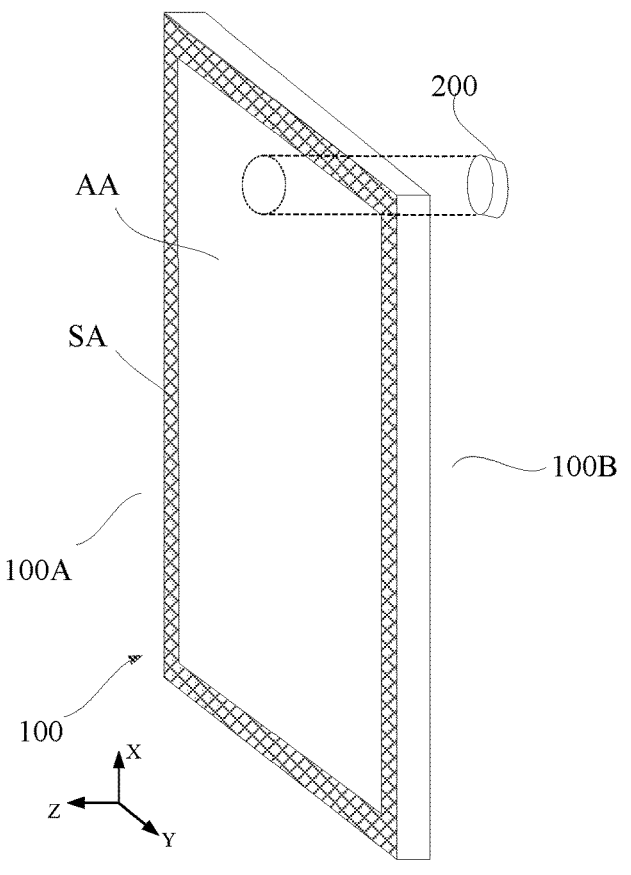
FIG. 1 is a three-dimensional diagram of a display panel according to at least one embodiment of the present disclosure.

The embodiments of the present disclosure will be described below with reference to the drawings in detail. Implementations may be practiced in multiple different forms. Those of ordinary skills in the art may easily understand such a fact that manners and contents may be transformed into other forms without departing from the purpose and scope of the present disclosure. Therefore, the present disclosure should not be explained as being limited to contents described in following embodiments only. The embodiments in the present disclosure and features in the embodiments may be combined randomly with each other if there is no conflict.

In the drawings, a size of one or more constituent elements, a thickness of a layer, or a region is sometimes exaggerated for clarity. Therefore, an implementation of the present disclosure is not necessarily limited to the size, and a shape and a size of one or more components in the drawings do not reflect an actual scale. In addition, the drawings schematically illustrate ideal examples, and one implementation of the present disclosure is not limited to the shapes, numerical values, or the like shown in the drawings.

Ordinal numerals such as "first", "second", and "third" in the specification are set to avoid confusion between constituent elements, but not to set a limit in quantity. In the present disclosure, "multiple" represents two or more than two.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred device or element must have a particular orientation and be constructed and operated in the particular orientation. Therefore, they cannot be understood as limitations on the present disclosure. The positional relationships between the constituent elements are changed as appropriate according to a direction for describing the constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, a connection may be a fixed connection, a detachable connection, or an integrated connection, it may be a mechanical connection or a connection, it may be a direct connection, an indirect connection through an intermediate component, or an internal communication between two components. Those of ordinary skills in the art may understand meanings of the above-mentioned terms in the present disclosure according to situations.

In the specification, "electrical connection" includes a case that constituent elements are connected together through an element with a certain electrical effect. The "element with the certain electrical function" is not particularly limited as long as electrical signals between the connected constituent elements can be transmitted. Examples of the "element with the certain electrical function" not only include an electrode and a wiring, but further include a switch element such as a transistor, a resistor, an inductor, a capacitor, another element with multiple functions, etc.

In the specification, a transistor refers to an element which at least includes three terminals, i.e., a gate, a drain, and a source. The transistor has a channel region between the drain (drain terminal, drain region, or drain electrode) and the source (source terminal, source region, or source electrode), and a current can flow through the drain, the channel region, and the source. In the specification, the channel region refers to a region through which the current mainly flows.

In the specification, a first electrode may be a drain and a second electrode may be a source, or, the first electrode may be a source and the second electrode may be a drain. In a case that transistors with opposite polarities are used, or in a case that a direction of a current changes during operation of a circuit, or the like, functions of the "source" and the "drain" may sometimes be interchangeable. Therefore, the "source" and the "drain" may be interchangeable in the specification. In addition, the gate may also be referred to as a control electrode.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

Triangle, rectangle, trapezoid, pentagon and hexagon in this specification are not strictly defined, and they may be approximate triangle, rectangle, trapezoid, pentagon or hexagon, etc. There may be some small deformation caused by tolerance, and there may be chamfers, arc edges and deformations, etc.

A "light transmittance" in the present disclosure refers to an ability of light passing through a medium, and is a percentage of luminous flux passing through a transparent or translucent body to its incident luminous flux.

In the present disclosure, "about" and "substantially" refer to a case that a boundary is not defined strictly and a process and measurement error within a range is allowed. In the present disclosure, "substantially the same" is a case where values differ by less than 10%.

At least one embodiment of the present disclosure provides a display device, including a display panel. The display device may be a product having a function of displaying an image (including a still image or a moving image, wherein the moving image may be a video). For example, the display device may be: display, television, billboard, digital photo frame, laser printer with a display function, telephone, mobile phone, picture screen, personal digital assistant (PDA), digital camera, portable camcorder, viewfinder, navigator, vehicle, large-area wall, information inquiry equipment (such as business inquiry equipment in e-government, banks, hospitals, power departments, etc.), monitor, etc. As another example, the display device may be any one of a microdisplay, a VR (Virtual Reality) device including a microdisplay, or an AR (Augmented Reality) device.

Figure 2:
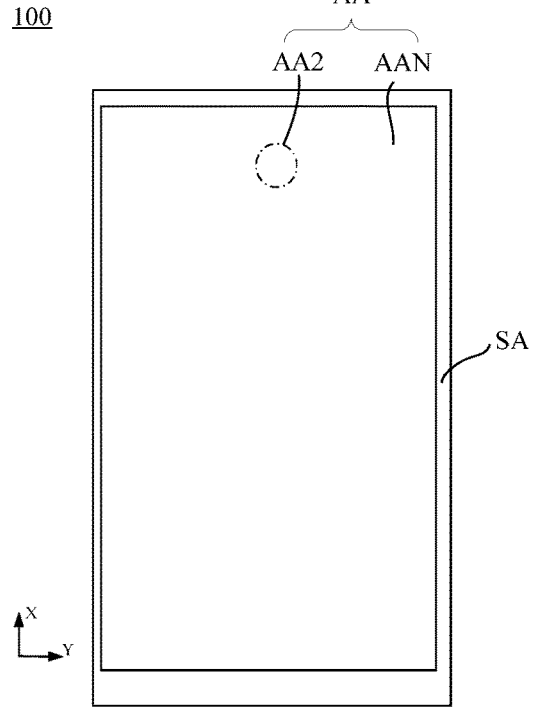
FIG. 2 is a schematic diagram of a display panel according to at least one embodiment of the present disclosure.

FIG. 1 is a three-dimensional view of a display device according to at least one embodiment of the present disclosure. FIG. 2 is a schematic diagram of a display panel according to at least one embodiment of the present disclosure. In some exemplary embodiments, as shown in FIGS. 1 and 2, the display device may include: a display panel 100 and a sensor 200. The display panel 100 may be a pad for displaying images. For example, the display panel 100 may be referred to as a screen, and may be, for example, a liquid crystal display panel, an OLED (Organic Light Emitting Diode) display panel or the like. For example, the sensor 200 may be an infrared sensor, an ultrasonic sensor, a LIDAR (Light Detection and Ranging) sensor, a Radar sensor, a camera sensor and the like.

In some examples, as shown in FIG. 1, the display panel 100 may have a display side 100A and a non-display side 100B. The display side 100A may be a side on which the display panel 100 can display an image. When a human eye is on the display side 100A, the image displayed on the display panel 100 can be viewed. The non-display side 100B is opposite to the display side 100A. The sensor 200 may be provided on the non-display side 100B of the display panel 100 and therefore the sensor 200 may be referred to as an under-screen sensor. Since the sensor 200 needs to receive an optical signal transmitted from the outside through the display panel 100, the display panel 100 needs to have a higher light transmittance in a region corresponding to the sensor 200. The display panel 100 may have a display area AA and a periphery area SA, and the X direction in FIG. 1 may be an extension direction of one of the side edges of the display area AA, for example, an extension direction of a long side edge. The Y direction may be an extension direction of another side edge of the display area AA, for example, an extension direction of a short side edge. The Z direction in FIG. 1 may be a vertical direction of the display area AA.

In some examples, as shown in FIG. 2, the periphery area SA may be located on at least one side outside the display area AA (e.g. on one side of the display area AA; or around the display area AA, i.e. including upper and lower sides and left and right sides, for another example). The display area AA may include a sensor correspondence region (hereinafter referred to as a second region for consistency in the full text) AA2 and a sensor non-correspondence region AAN that do not overlap each other. A light transmittance of the second region AA2 is higher than a light transmittance of the sensor non-correspondence region AAN. An orthographic projection of the sensor 200 on the display panel 100 overlaps with the second region AA2, so that more light can pass through the display panel 100 and be received by the sensor 200. For example, a portion of the orthographic projection of the sensor 200 on the display panel 100 is located in the second region AA2. As another example, the entire orthographic projection of the sensor 200 on the display panel 100 is located in the second region AA2. As another example, an orthographic projection of a photosensitive window of the sensor 200 on the display panel 100 is located in the second region AA2. The sensor non-correspondence region AAN is a region in the display area AA other than the second region AA2.

In some examples, as shown in FIG. 2, the second region AA2 may be located in the middle of the top of the display area AA. The sensor non-correspondence region AAN may surround the second region AA2. However, this embodiment is not limited thereto. For example, the second region AA2 may be located in other positions such as an upper left corner or an upper right corner of the display area AA. As another example, the sensor non-correspondence region AAN may surround at least one side of the second region AA2.

In some examples, as shown in FIG. 2, the display area AA may be a rectangle, such as a rounded rectangle. The second region AA2 may be circular. However, this embodiment is not limited thereto. For example, the second region may be rectangular, pentagonal, hexagonal or in another shape.

In some examples, the display area AA may be provided with multiple sub-pixels. A sub-pixel may be a smallest part with controllable brightness. At least one sub-pixel may include a pixel drive circuit and a light emitting device. The pixel drive circuit may be electrically connected to the light emitting device and configured to drive a light emitting device with which it is connected to emit light. The pixel drive circuit may include multiple transistors (denoted by T) and at least one capacitor (denoted by C), for example, the pixel drive circuit may be in a 3T1C (i.e., three transistors and one capacitor) structure, a 7T1C (i.e., seven transistors and one capacitor) structure, a 5T1C (i.e., five transistors and one capacitor) structure, an 8T1C (i.e., eight transistors and one capacitor) structure, or an 8T2C (i.e., eight transistors and two capacitors) structure, etc.

In some examples, the light emitting device may be any of a Light Emitting Diode (LED), an Organic Light Emitting Diode (OLED), a Quantum Dot Light Emitting Diode (QLED), a micro LED (including: mini-LED or micro-LED), and the like. For example, the light emitting device may be an OLED, and the light emitting device emits red light, green light, blue light, or white light, etc. under driving by its corresponding pixel drive circuit. A color of light emitted from the light emitting device may be determined as required. In some examples, the light emitting device may include an anode, a cathode, and an organic light emitting layer disposed between the anode and the cathode. The anode of the light emitting device may be electrically connected with the corresponding pixel drive circuit. However, this embodiment is not limited thereto.

In some examples, one pixel unit in the display area AA may include three sub-pixels, i.e., a red sub-pixel, a green sub-pixel, and a blue sub-pixel respectively. However, this embodiment is not limited thereto. In some examples, one pixel unit may include four sub-pixels, which may be a red sub-pixel, a green sub-pixel, a blue sub-pixel, and a white sub-pixel respectively.

In some examples, a shape of the light emitting device may be a rectangle, a rhombus, a pentagon, or a hexagon. When one pixel unit includes three sub-pixels, light emitting devices of the three sub-pixels may be arranged side by side horizontally, side by side vertically, or in a pyramid form. When one pixel unit includes four sub-pixels, light emitting devices of the four sub-pixels may be arranged side by side horizontally, side by side vertically, or in a square form. However, this embodiment is not limited thereto.

Figure 3:
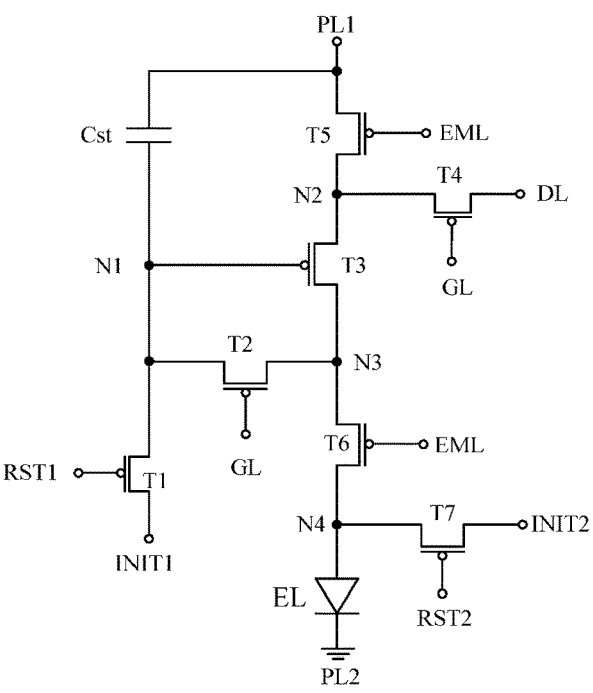
FIG. 3 is an equivalent circuit diagram of a pixel drive circuit according to at least one embodiment of the present disclosure.

FIG. 3 is an equivalent circuit diagram of a pixel drive circuit according to at least one embodiment of the present disclosure. The pixel drive circuit of this exemplary embodiment is described with a 7T1C structure as an example. However, this embodiment is not limited thereto.

In some exemplary implementations, as shown in FIG. 3, the pixel drive circuit of this example may include six switching transistors (T1, T2, and T4 to T7), one drive transistor T3, and one storage capacitor Cst. The six switching transistors are respectively a data writing transistor T4, a threshold compensation transistor T2, a first light emitting control transistor T5, a second light emitting control transistor T6, a first reset transistor T1, and a second reset transistor T7. The light emitting element E1 may include an anode, a cathode and an organic light emitting layer disposed between the anode and the cathode.

In some exemplary embodiments, the drive transistor and the six switching transistors may be P-type transistors or may be N-type transistors. Use of a same type of transistors in a pixel drive circuit may simplify a process flow, reduce process difficulties of a display panel, and improve a product yield. In some exemplary embodiments, the drive transistor and the six switching transistors may include a P-type transistor and an N-type transistor.

In some exemplary embodiments, low temperature poly-silicon thin film transistors, or oxide thin film transistors, or a low temperature poly-silicon thin film transistor and an oxide thin film transistor may be used for the drive transistor and the six switching transistors. An active layer of a low temperature poly-silicon thin film transistor is made of low temperature poly-silicon (LTPS), and an active layer of an oxide thin film transistor is made of an oxide semiconductor (Oxide). A low-temperature poly-silicon thin film transistor has advantages such as a high mobility and fast charging, while an oxide thin film transistor has an advantage such as a low leakage current. The low temperature poly-silicon thin film transistor and the oxide thin film transistor are integrated on one display panel to form a low temperature polycrystalline oxide (LTPO) display panel, and advantages of both the low temperature poly-silicon thin film transistor and the oxide thin film transistor may be utilized, which may achieve low frequency drive, reduce power consumption, and improve display quality.

In some exemplary implementations, as shown in FIG. 3, a display panel may include a scan line GL, a data line DL, a first power supply line PL1, a second power supply line PL2, an emitting control line EML, a first initial signal line INIT1, a second initial signal line INIT2, a first reset control line RST1, and a second reset control line RST2. In some examples, the first power supply line PL1 may be configured to provide a constant first voltage signal VDD to a pixel drive circuit, the second power supply line PL2 may be configured to provide a constant second voltage signal VSS to a pixel drive circuit, and the first voltage signal VDD is greater than the second voltage signal VSS. The scan line GL may be configured to provide a scan signal SCAN to a pixel drive circuit, the data line DL may be configured to provide a data signal DATA to a pixel drive circuit, the light emitting control line EML may be configured to provide a light emitting control signal EM to a pixel drive circuit, the first reset control line RST1 may be configured to provide a first reset control signal RESET1 to a pixel drive circuit, and the second reset control line RST2 may be configured to provide a second reset control signal RESET2 to a pixel drive circuit. In some examples, in a pixel drive circuit of an n-th row, a first reset control line RST1 may be electrically connected to a scan line GL of a pixel drive circuit of an (n−1)-th row to allow a scan signal SCAN(n−1) to be inputted into the first reset control line RST1, that is, a first reset control signal RESET1(n) is the same as the scan signal SCAN(n−1). A second reset control line RST2 may be electrically connected to a scan line GL of the pixel drive circuit of the n-th row to be allow a scan signal SCAN(n) to be inputted into the second reset control line RST2, that is, a second reset control signal RESET2(n) is the same as the scan signal SCAN(n). In some examples, the second reset control line RST2 with which the pixel drive circuit of the n-th row is electrically connected and a first reset control line RST1 with which a pixel drive circuit of an (n+1)-th row is electrically connected may be in an integral structure. Herein, n is an integer greater than 0. In this way, signal lines of the display panel can be reduced to achieve a narrow bezel design of the display panel. However, this embodiment is not limited thereto.

In some exemplary implementations, the first initial signal line INIT1 may be configured to provide a first initial signal to the pixel drive circuit, the second initial signal line INIT2 may be configured to provide a second initial signal to the pixel drive circuit. For example, the first initial signal may be different from the second initial signal. The first initial signal and the second initial signal may be constant voltage signals, and their magnitudes may be between the first voltage signal VDD and the second voltage signal VSS, but not limited thereto. In some other examples, the first initial signal and the second initial signal may be the same, and only the first initial signal line may be provided for providing the first initial signal.

In some exemplary embodiments, as shown in FIG. 3, the drive transistor T3 is electrically connected with the light emitting element EL, and outputs a drive current to drive the light emitting element EL to emit light under control of the scan signal SCAN, the data signal DATA, the first voltage signal VDD, the second voltage signal VSS and the like. A gate of the data writing transistor T4 is electrically connected to the scan line GL, a first electrode of the data writing transistor T4 is electrically connected to the data line DL, and a second electrode of the data writing transistor T4 is electrically connected to a first electrode of the drive transistor T3. A gate of the threshold compensation transistor T2 is electrically connected to the scan line GL, a first electrode of the threshold compensation transistor T2 is electrically connected to a gate of the drive transistor T3, and a second electrode of the threshold compensation transistor T2 is electrically connected to a second electrode of the drive transistor T3. A gate of the first light emitting control transistor T5 is electrically connected to the light emitting control line EML, a first electrode of the first light emitting control transistor T5 is electrically connected to the first power supply line PL1, and a second electrode of the first light emitting control transistor T5 is electrically connected to the first electrode of the drive transistor T3. A gate of the second light emitting control transistor T6 is electrically connected to the light emitting control line EML, a first electrode of the second light emitting control transistor T6 is electrically connected to the second electrode of the drive transistor T3, and a second electrode of the second light emitting control transistor T6 is electrically connected to an anode of the light emitting element EL. The first reset transistor T1 is electrically connected to the gate of the drive transistor T3 and configured to reset the gate of the drive transistor T3, and the second reset transistor T7 is electrically connected to the anode of the light emitting element EL and configured to reset the anode of the light emitting element EL. A gate of the first reset transistor T1 is electrically connected to the first reset control line RST1, a first electrode of the first reset transistor T1 is electrically connected to the first initial signal line INIT1, and a second electrode of the first reset transistor T1 is electrically connected to the gate of the drive transistor T3. A gate of the second reset transistor T7 is electrically connected to the second reset control line RST2, a first electrode of the second reset transistor T7 is electrically connected to the second initial signal line INIT2, and a second electrode of the second reset transistor T7 is electrically connected to the anode of the light emitting element EL. A first capacitor plate of the storage capacitor Cst is electrically connected to the gate of the drive transistor T3, and a second capacitor plate of the storage capacitor Cst is electrically connected to the first power supply line PL1.

In this example, a first node N1 is a connection point of the storage capacitor Cst, the first reset transistor T1, the drive transistor T3, and the threshold compensation transistor T2. A second node N2 is a connection point of the first light emitting control transistor T5, the data writing transistor T4, and the drive transistor T3. A third node N3 is a connection point of the drive transistor T3, the threshold compensation transistor T2, and the second light emitting control transistor T6. A fourth node N4 is a connection point of the second light emitting control transistor T6, the second reset transistor T7, and the light emitting element EL. The fourth node N4 is an anode connection node.

An operating process of the pixel drive circuit shown in FIG. 3 will be described below. The description is made by taking a case in which multiple transistors included in the pixel drive circuit shown in FIG. 3 are all P-type transistors as an example.

In some exemplary embodiments, during one frame of display period, the operating process of the pixel drive circuit may include a first stage S1, a second stage S2, and a third stage S3.

In the first stage S1, which is referred to as a reset stage, a first reset control signal RESET1 provided by the first reset control line RST1 is a low-level signal, so that the first reset transistor T1 is turned on, and a first initial signal provided by the first initial signal line INIT1 is provided to the first node N1 to initialize the first node N1 and clear an original data voltage in the storage capacitor Cst. A scan signal SCAN provided by the scan line GL is a high-level signal, and a light emitting control signal EM provided by the light emitting control line EML is a high-level signal, so that the data writing transistor T4, the threshold compensation transistor T2, the first light emitting control transistor T5, the second light emitting control transistor T6, and the second reset transistor T7 are turned off. In this stage, the light emitting element EL does not emit light.

In the second stage S2, which is referred to as a data writing stage or a threshold compensation stage, the scan signal SCAN provided by the scan line GL is a low-level signal, the first reset control signal RESET1 provided by the first reset control line RST1 and the emitting control signal EM provided by the emitting control line EML are both high-level signals, and the data line DL outputs a data signal DATA. In this phase, the first capacitor plate of the storage capacitor Cst is at a low-level, such that the drive transistor T3 is turned on. The scan signal SCAN is the low-level signal, so that the threshold compensation transistor T2, the data writing transistor T4, and the second reset transistor T7 are turned on. The threshold compensation transistor T2 and the data writing transistor T4 are turned on, so that a data voltage Vdata output by the data line DL is provided to the first node N1 through the second node N2, the turned-on drive transistor T3, the third node N3, and the turned-on threshold compensation transistor T2, and the storage capacitor Cst is charged with a difference between the data voltage Vdata output by the data line DL and a threshold voltage of the drive transistor T3. A voltage of the first capacitor plate (that is, the first node N1) of the storage capacitor Cst is Vdata-|Vth|, wherein Vdata is the data voltage output by the data line DL, and Vth is the threshold voltage of the drive transistor T3. The second reset transistor T7 is turned on, so that a second initial signal provided by the second initial signal line INIT2 is provided to the anode of the light emitting element EL to initialize (reset) the anode of the light emitting element EL and clear a pre-stored voltage therein, so as to complete initialization, thereby ensuring that the light emitting element EL does not emit light. The first reset control signal RESET1 provided by the first reset control line RST1 is the high-level signal, so that the first reset transistor T1 is turned off. The light emitting control signal EM provided by the light emitting control signal line EML is the high-level signal, so that the first light emitting control transistor T5 and the second light emitting control transistor T6 are turned off.

In the third stage S3, which is referred to as a light emitting stage, the light emitting control signal EM provided by the light emitting control signal line EML is a low-level signal, and the scan signal SCAN provided by the scan line GL and the first reset control signal RESET1 provided by the first reset control line RST1 are high-level signals. The light emitting control signal EM provided by the light emitting control signal line EML is the low-level signal, so that the first light emitting control transistor T5 and the second light emitting control transistor T6 are turned on, and a first voltage signal VDD output by the first power supply line PL1 provides a drive voltage to the anode of the light emitting element EL through the turned-on first light emitting control transistor T5, the drive transistor T3, and the second light emitting control transistor T6 to drive the light emitting element EL to emit light.

In a drive process of the pixel circuit, a drive current flowing through the drive transistor T3 is determined by a voltage difference between the gate and the first electrode of the drive transistor T3. Because the voltage of the first node N1 is Vdata-|Vth|, the drive current of the drive transistor T3 is as follows:

$$I = K \times (Vgs - Vth)^2 =$$
$$K \times [(VDD - Vdata + |Vth|) - Vth]^2 = K \times [VDD - Vdata]^2.$$

Among them, I is the drive current flowing through the drive transistor T3, that is, the drive current for driving the light emitting element EL; K is a constant; Vgs is the voltage difference between the gate and the first electrode of the drive transistor T3; Vth is the threshold voltage of the drive transistor T3; Vdata is the data voltage output by the data line DL; and VDD is the first voltage signal output by the first power supply line PL1.

It may be seen from the above formula that a current flowing through the light emitting element EL has nothing to do with the threshold voltage of the drive transistor T3. Therefore, the pixel drive circuit of this embodiment can better compensate the threshold voltage of the drive transistor T3.

Figure 4:
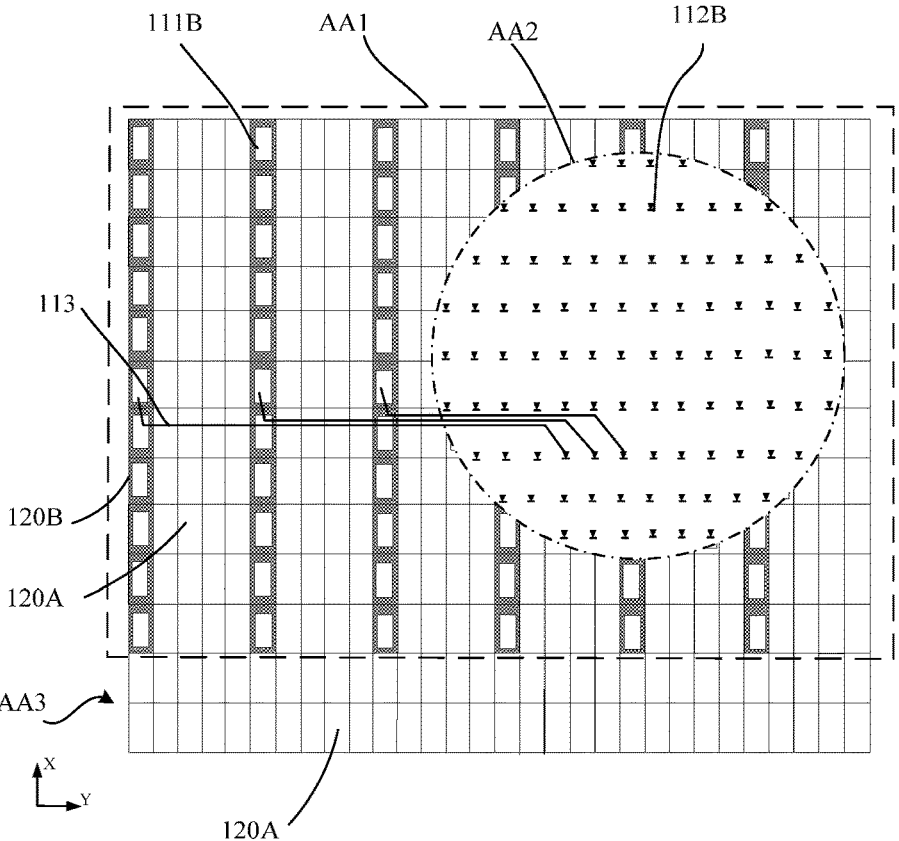
FIG. 4 is a partial schematic view of a display panel according to at least one embodiment of the present disclosure.

FIG. 4 is a partial schematic view of a display panel according to at least one embodiment of the present disclosure. In some examples, as shown in FIG. 4 the display area AA of the display panel 100 may include a first region AA1 and a second region AA2. The first region AA1 may be located on at least one side outside the second region AA2 (e.g. on one side of the second region AA2, or around the second region AA2, i.e. including upper and lower sides and left and right sides). The first region AA1 may be located in the sensor non-correspondence region AAN in FIG. 2.

In this example, a region occupied by one pixel drive circuit may be referred to as a sub-pixel region. The first region AA1 may include multiple sub-pixel regions arranged in an array. The sub-pixel regions in the first region AA1 may include a normal sub-pixel region 120A and a dummy sub-pixel region 120B. The normal sub-pixel region 120A may be provided with a first pixel drive circuit. A first light emitting device electrically connected to the first pixel drive circuit and the first pixel drive circuit may both be located in the first region AA1, and all or part of the first light emitting device may be located in the normal sub-pixel region 120A. The dummy sub-pixel region 120B may be provided with a second pixel drive circuit or an invalid pixel drive circuit, and a second light emitting device 112B electrically connected to the second pixel drive circuit may be located in the second region AA2. Arrangement of the invalid pixel circuit is conducive to improving uniformity of components of multiple film layers in an etching process. For example, a structure of the invalid pixel circuit may be substantially the same as that of the first pixel drive circuit or the second pixel drive circuit of the row or column where the invalid pixel circuit is located, except that invalid pixel circuit is not electrically connected to any light emitting device.

In some examples, as shown in FIG. 4, the second region AA2 may include multiple second light emitting devices 112B arranged in an array. At least one second light emitting device 112B in the second region AA2 may be electrically connected to the second pixel drive circuit 111B in the dummy sub-pixel region 120B in the first region AA1 to drive the second light emitting device to emit light. At least one second pixel drive circuit in the dummy sub-pixel region 120B in the first region AA1 may be electrically connected to at least one second light emitting device 112B in the second region AA2 through a conductive line 113 (e.g. a transparent conductive line). In this embodiment, each second light emitting device 112B in the second region AA2 may be electrically connected to a second pixel drive circuit in t dummy sub-pixel region 120B in the first region AA1 through at least one conductive line 113. By providing the second pixel drive circuit for driving the second light emitting device 112B in the first region AA1, shielding of light by the pixel drive circuit is reduced, thereby increasing the light transmittance of the second region AA2.

In some examples, as shown in FIG. 4, the display area AA of the display panel 100 may include a third region AA3 in addition to the first region AA1 and the second region AA2. The third region AA3 may include multiple sub-pixel regions arranged in an array, each of the sub-pixel regions may be a normal sub-pixel region 120A. A first pixel drive circuit located in a normal sub-pixel region 120A and a first light emitting device electrically connected to the first pixel drive circuit may all be located in the third region AA3.

In some examples, the third region AA3 may include a normal sub-pixel region and a dummy sub-pixel region, and the normal sub-pixel region and the dummy sub-pixel region of the third region AA3 may be arranged in a same manner as the normal sub-pixel region and the dummy sub-pixel region of the first region AA1. The dummy sub-pixel region of the third region AA3 may include an invalid pixel drive circuit.

In some examples, as shown in FIG. 4, the second region AA2 may include multiple second light emitting devices and the first region AA1 may include multiple first light emitting devices and multiple pixel drive circuits. The multiple pixel drive circuits may include multiple first pixel drive circuits, multiple second pixel drive circuits, and multiple invalid pixel drive circuits. At least one of the multiple second pixel drive circuits may be electrically connected to at least one of the multiple second light emitting devices through a conductive line 113, and an orthographic projection of the at least one second pixel drive circuit on a base substrate and an orthographic projection of the at least one second light emitting device on the base substrate may not overlap. At least one second pixel drive circuit may be configured to provide a drive signal to the second light emitting device to which it is electrically connected, so as to drive the second light emitting device to emit light, At least one of the multiple first pixel drive circuits may be electrically connected to at least one of the multiple first light emitting devices. An orthographic projection of the at least one first pixel drive circuit on the base substrate and an orthographic projection of the at least one first light emitting device on the base substrate may at least partially overlap. One end of the conductive line 113 may be electrically connected to a second pixel drive circuit and the other end of the conductive line 113 may be electrically connected to a second light emitting device. The conductive line 113 may extend from the first region AA1 to the second region AA2. However, this embodiment is not limited thereto.

In some examples, the conductive line 113 may be made of a transparent conductive material, for example, it may be made of a conductive oxide material such as indium tin oxide (ITO). However, this embodiment is not limited thereto.

In some examples, since the first region AA1 is provided with not only a first pixel drive circuit electrically connected to the first light emitting device, but also a second pixel drive circuit 111B electrically connected to the second light emitting device 112B, the number of pixel drive circuits of the first region AA1 may be greater than the number of the first light emitting devices. In this example, as shown in FIG. 4, the region where the second pixel drive circuit is disposed may be obtained by reducing a size of a first pixel drive circuit in the Y direction. For example, the size of the pixel drive circuit in the Y direction may be smaller than the size of the first light emitting device in the Y direction. In this example, as shown in FIG. 4, the original pixel drive circuits in each "a" column may be compressed in the Y direction, thereby adding an arrangement space for another one column of pixel drive circuits, and the space occupied by the "a" column of pixel drive circuits before compression and the "a+1" columns of pixel drive circuits after compression may be the same. Herein, "a" may be an integer greater than 1. In this example, "a" may be equal to 4. However, this embodiment is not limited thereto. For example, "a" may be equal to 2 or 3. In some other examples, the original "b" row of pixel drive circuits may be compressed along the X direction, thereby increasing the arrangement space of one row of pixel drive circuits, and the space occupied by the "b" row of pixel drive circuit before compression and the "b+1" rows of pixel drive circuits after compression is the same. Herein, "b" may be an integer greater than 1. Alternatively, the region in which the second pixel drive circuit is provided may be obtained by reducing the size of the first pixel drive circuit in the X direction and the Y direction.

In the embodiment of the present disclosure, a row of light emitting devices may mean that pixel drive circuits connected to the row of light emitting devices are all connected to one same gate line (for example, a scan line). A row of pixel drive circuits may mean that the row of pixel drive circuits are all connected to a same gate line. However, this embodiment is not limited thereto.

In some implementations, in order to increase the light transmittance of the second region, a second pixel drive circuit to which the second light emitting device of the second region is electrically connected is disposed in the first region, and an anode of the second light emitting device and the second pixel drive circuit are electrically connected through a conductive line. Taking the pixel drive circuit of 7T1C shown in FIG. 3 as an example, one end of the conductive line may be electrically connected to the fourth node N4 of the second pixel drive circuit, and the other end of the conductive line may be electrically connected to the anode of the second light emitting device. Since the conductive line needs to extend from the first region to the second region to achieve the electrical connection between the second pixel drive circuit and the second light emitting device, the conductive line increases a capacitance of the fourth node N4 (i.e., the anode connection node) of the second pixel drive circuit. The capacitance of the anode connection node may include a capacitance between the conductive line and the pixel drive circuit and a parasitic capacitance between different conductive lines. Parasitic capacitance of anode connection nodes of different second pixel drive circuits can cause crosstalk between the second light emitting devices, which affects the display effect.

FIG. 5 is a schematic simulation diagram of the influence of a light emitting device emitting blue light on a light emitting device emitting green light. In FIG. 5, the dotted line shows a current variation curve of an anode connection node of the light emitting device emitting green light in one frame when there is crosstalk between the anode connection node of the light emitting device emitting green light and an anode connection node of the light emitting device emitting blue light. The solid line indicates a current variation curve of the anode connection node of the light emitting device emitting green light in one frame when there is no crosstalk between the anode connection node of the light emitting device emitting green light and the anode connection node of the light emitting device emitting blue light. As may be seen from FIG. 5, when there is crosstalk between the anode connection node of the light emitting device emitting green light and the anode connection node of the light emitting device emitting blue light, the current of the anode connection node of the light emitting device emitting green light will be easily pulled up by the anode connection node of the light emitting device emitting blue light, thereby causing the brightness of the light emitting device emitting green light subjected to crosstalk to increase, resulting in poor display of the second region.

The multiple second light emitting devices in the second region of the display panel provided in the present embodiment may include multiple first type second light emitting devices and multiple second type second light emitting devices. The first type second light emitting devices may be configured to emit light of a first color, and the second type second light emitting devices may be configured to emit light of a second color. The light of the first color may be different from the light of the second color. In some examples, the light of the first color may be green light and the light of the second color may include at least one of the following: red light and blue light. In some examples, the first type second light emitting devices may include light emitting devices emitting green light, and the second type second light emitting devices may include a light emitting device emitting blue light and a light emitting device emitting red light.

In some exemplary embodiments, the second region may be divided into a first sub-region and a second sub-region. The second sub-region may surround the first sub-region and be adjacent to the first region. A parasitic capacitance between an anode connection node of at least one first type second light emitting device and an anode connection node of a second type second light emitting device located in the first sub-region may be less than or equal to a maximum parasitic capacitance between an anode connection node of a first type second light emitting device and an anode connection node of a second type second light emitting device located in the second sub-region. In this example, the parasitic capacitance between the anode connection node of the first type second light emitting device and the anode connection node of the second type second light emitting device in the first sub-region is reduced, crosstalk between the first type first light emitting device and the second type first light emitting device may be improved, thereby improving the display uniformity of the second region to improve the display effect.

In some exemplary embodiments, the multiple second light emitting devices of the second region may include multiple sets of second light emitting devices. A second light emitting device in each of the multiple sets of second light emitting devices may be arranged in a first direction, and the multiple sets of second light emitting devices may be arranged in a second direction. The second direction intersects the first direction, for example, the second direction and the first direction are perpendicular to each other. For example, the first direction may be parallel to the aforementioned Y direction and the second direction may be parallel to the aforementioned X direction.

In some exemplary embodiments, the display panel may include three transparent conductive layers, and the three transparent conductive layers may include a first transparent conductive layer, a second transparent conductive layer, and a third transparent conductive layer arranged in sequence on a side away from the base substrate. The first transparent conductive layer may include multiple first transparent conductive lines, the second transparent conductive layer may include multiple second transparent conductive lines, and the third transparent conductive layer may include multiple third transparent conductive lines. There may be an overlap between an orthographic projection of a portion of the first transparent conductive lines of the first transparent conductive layer extending in the first direction on the base substrate and an orthographic projection of a portion of the second transparent conductive lines of the second transparent conductive layer extending in the first direction on the base substrate, i.e., there is an overlapping wiring. There may be no overlap between an orthographic projection of a portion of the third transparent conductive lines of the third transparent conductive layer extending in the first direction on the base substrate and an orthographic projection of a portion of the first transparent conductive lines of the first transparent conductive layer and the second transparent conductive lines of the second transparent conductive layer extending in the first direction on the base substrate, i.e., there is no overlapping wiring. For example, a portion of the first transparent conductive lines of the first transparent conductive layer extending in the first direction, a portion of the second transparent conductive lines of the second transparent conductive layer extending in the first direction, and a portion of the third transparent conductive lines of the third transparent conductive layer extending in the first direction may have substantially the same length in the second direction.

In some examples, there exist overlapping wirings between the first transparent conductive lines of the first transparent conductive layer and the second transparent conductive lines of the second transparent conductive layer. For example, a capacitance between a first transparent conductive line and a second transparent conductive line overlapped with the first transparent conductive line may be about 5.396 fF, and a parasitic capacitance between a first transparent conductive line and a second transparent conductive line not overlapped with the first transparent conductive line may be about 0.436 fF. There is no overlapping wiring between the third transparent conductive lines of the third transparent conductive layer and the first transparent conductive lines as well as the second transparent conductive lines. For example, a parasitic capacitance between a third transparent conductive line and a second transparent conductive line may be about 3.054 fF. It may be seen that a parasitic capacitance between any transparent conductive line and a transparent conductive line not overlapped with it is smaller than a capacitance between any transparent conductive line and a wiring overlapped with it. In this example, crosstalk between the first type second light emitting device and the second type second light emitting device can be improved by designing a film layer where the conductive lines electrically connecting the first type second light emitting devices and the second type second light emitting devices are located.

Taking a display panel including three transparent conductive layers as an example, the second region may be divided into a left half region and a right half region along a center line in the first direction, and conductive lines connected to the second light emitting devices in the left half region and the right region may be approximately symmetrical about the center line. A connection relationship between a part of a set of second light emitting devices in the left half region of the second region and a row of second pixel drive circuits will be described as an example. The illustration of the first pixel drive circuits and the first light emitting devices may be omitted from the illustration of the following example.

In some examples, in the display panel, the capacitance of the conductive lines varies greatly. Different lengths of conductive lines of multiple light emitting devices located in the second region will cause different capacitance differences of light emitting devices emitting light of different colors. Compared with the capacitance difference of the conductive lines connected to the light emitting devices emitting red light and the capacitance difference of the conductive lines connected to the light emitting device emitting blue light, the capacitance difference of the conductive lines connected to the light emitting devices emitting green light is larger. Because the capacitance difference of the conductive lines connected to the light emitting devices emitting green light is larger, luminous time of the light emitting devices emitting green light will be reduced, thus the brightness difference of the display panel will appear, resulting in poor display. At a low gray scale, a defective degree of the light emitting devices emitting green light is greater than that of the light emitting devices emitting red light, and the defective degree of the light emitting devices emitting red light is greater than that of the light emitting devices emitting blue light. For example, at a same gray scale, a drive current for driving a light emitting device emitting blue light may be greater than a drive current for driving a light emitting device emitting red light, and a drive current for driving a light emitting device emitting red light may be greater than a drive current for driving a light emitting device emitting green light. The drive current for driving the light emitting device emitting green light is the smallest among the light emitting devices for the three primary colors, so the light emitting device emitting green light is least likely to be turned on when the capacitance of anode connection nodes of the light emitting devices emitting different light is the same. In order to ensure that the light emitting devices emitting green light can be turned on normally, it is necessary to reduce lengths of conductive lines connected to the anode connection nodes of the light emitting devices emitting green light, so as to reduce the capacitance of the anode connection nodes. In the following example, taking a second pixel drive circuit electrically connected to the light emitting device emitting green light closest to the second region as an example, i.e., the second pixel drive circuit electrically connected to the light emitting device emitting green light is preferentially arranged close to the second region. In some examples, an element A being close to an element B may mean that there is no other element A or element B between the element A and the element B, but there may be elements other than element A and element B therebetween. In this example, the second pixel drive circuit to which the light emitting device emitting green light is electrically connected is close to the second region may mean that there is no second pixel drive circuit electrically connected to light emitting devices emitting red light and blue light between the second pixel drive circuit electrically connected to the light emitting device emitting green light and the second region. However, there may be a first pixel drive circuit and an invalid pixel drive circuit therebetween.

In some examples, the multiple second light emitting devices of the second region may include multiple light emitting devices emitting green light 12A multiple light emitting devices emitting blue light 12B and multiple light emitting devices emitting red light 12C. The second light emitting devices emitting light 12A are configured to emit green light, the second light emitting devices emitting blue light 12B are configured to emit blue light, and the second light emitting devices emitting red light 12C are configured to emit red light. Among them, in at least one set of second light emitting devices, multiple second pixel drive circuits electrically connected to the second light emitting devices emitting green light 12A are closer to the second region than each of the multiple second pixel drive circuits electrically connected to the second light emitting devices emitting blue light 12B and the second light emitting devices emitting red light 12C, so as to reduce the length difference of the conductive lines electrically connected to the second light emitting devices emitting green light 12A, thereby reducing or avoiding display defects.

FIG. 6A is a schematic diagram of connection between a second light emitting device and a second pixel drive circuit according to at least one embodiment of the present disclosure. FIG. 6B is a schematic diagram of connection of a first transparent conductive line of a first transparent conductive layer in FIG. 6A. FIG. 6C is a schematic diagram of connection of a second transparent conductive line of a second transparent conductive layer in FIG. 6A. FIG. 6D is a schematic diagram of connection of a third transparent conductive line of a third transparent conductive layer in FIG. 6A. The first direction D1 may intersect with the second direction D2, for example, the first direction D1 may be perpendicular to the second direction D2. The first direction D1 may be parallel to the aforementioned Y direction and the second direction D2 may be parallel to the aforementioned X direction.

In some examples, as shown in FIGS. 6A to 6D, the second region AA2 may be divided into a first sub-region AA2a and a second sub-region AA2b. The second sub-region AA2b may surround the first sub-region A22a and be adjacent to the first region AA1. That is, the second sub-region AA2b may be located between the first sub-region AA2a and the first region AA1. The second sub-region AA2b may be an edge region of the second region AA2, and the first sub-region AA2a may be a center region of the second region AA2. In a set of second light emitting devices, the number of second light emitting devices emitting green light in the first sub-region AA2a may be less than or equal to the number of second light emitting devices emitting green light in the second sub-region AA2b. Taking the second region AA2 being a circle as an example, the first sub-region AA2a may be a circle smaller than the second region AA2, and the second sub-region AA2b may be a ring around the first sub-region AA2a. However, this embodiment is not limited thereto.

In some examples, as shown in FIGS. 6A and 6B, a second light emitting device emitting green light 12A in the second sub-region AA2b of the second region AA2 may be electrically connected to a second pixel drive circuit 111B in the first region AA1 through a first transparent conductive line 331 located in the first transparent conductive layer 330. As shown in FIG. 6C, the second light emitting device emitting green light 12A in the first sub-region AA2a may be electrically connected to the second pixel drive circuit 111B through a second transparent conductive line 341 located in the second transparent conductive layer 340. The first transparent conductive line 331 and the second transparent conductive line 341 to which the second light emitting device emitting green light 12A is electrically connected are located on a same side of the set of second light emitting devices in the second direction D2, for example, on the upper side.

In some examples, as shown in FIGS. 6C and 6D, multiple second light emitting devices emitting blue light 12B and second light emitting devices emitting red light 12C in the second sub-region AA2b adjacent to the first region AA1 may be electrically connected to a second pixel drive circuit 111B of the first region AA1 through a second transparent conductive line 341 located in the second transparent conductive layer 340. Multiple second light emitting devices emitting blue light 12B and second light emitting devices emitting red light 12C away from the first region AA1 may be electrically connected to the second pixel drive circuit 111B through a third transparent conductive line 351 located in the third transparent conductive layer 350. As shown in FIG. 6D, the second light emitting devices emitting blue light 12B and the second light emitting devices emitting red light 12C in the first sub-region AA2a may be electrically connected to the second pixel drive circuit 111B through the third transparent conductive line 351 of the third transparent conductive layer 350. Among them, the second transparent conductive line 341 and the third transparent conductive line 351 to which the second light emitting devices emitting blue light 12B and the second light emitting devices emitting red light 12C are electrically connected are located on opposite sides of the set of second light emitting devices in the second direction D2, for example, the second transparent conductive line 341 may be located on a lower side and the third transparent conductive line 351 may be located on an upper side.

In this example, for the second light emitting devices emitting green light 12A in the second region AA2, the second light emitting devices emitting green light 12A in the second sub-region AA2*b* may use wirings of the first transparent conductive layer 330, and the second light emitting devices emitting green light 12A away from the second sub-region AA2*b* may be electrically connected using wirings of the second transparent conductive layer 340 after utilizing an arrangement space for wirings of the first transparent conductive layer 330. However, this embodiment is not limited thereto. For example, the second light emitting devices emitting green light 12A away from the second sub-region AA2*b* may be electrically connected by wirings of the third transparent conductive layer 350.

FIG. 7 is a schematic diagram of a parasitic capacitance between an anode connection node of a second light emitting device emitting green light and an anode connection node of a second light emitting device emitting blue light or red light of the display panel shown in FIG. 6A. In FIG. 7, the abscissa indicates a position of the second light emitting device emitting green light from an edge of the second region to the center in the first direction of the second region, and the ordinate indicates a parasitic capacitance between an anode connection node of the second light emitting device emitting green light and an anode connection node of a second light emitting device emitting blue light or red light. In this example, a boundary between the first sub-region and the second sub-region may be between the positions of the 15th and 16th second light emitting devices emitting green light. As shown in FIGS. 6A and 7, in the second sub-region AA2*b*, there is less parasitic capacitance between the first transparent conductive line to which the second light emitting device emitting green light is electrically connected and the third transparent conductive line to which the other light emitting devices are electrically connected, so that crosstalk between the anode connection node of the second light emitting device emitting green light and the anode connection node of the second light emitting device emitting blue light or red light may be reduced. In the first sub-region AA2*a*, the second light emitting device emitting green light is electrically connected to the second transparent conductive line. The second light emitting device emitting blue light or red light are electrically connected to the third transparent conductive line, and there is a risk of increasing crosstalk between the anode connection node of the second light emitting device emitting green light and the anode connection node of the second light emitting device emitting blue light or red light due to a large parasitic capacitance between the second transparent conductive layer and the third transparent conductive layer.

Figure 8A:
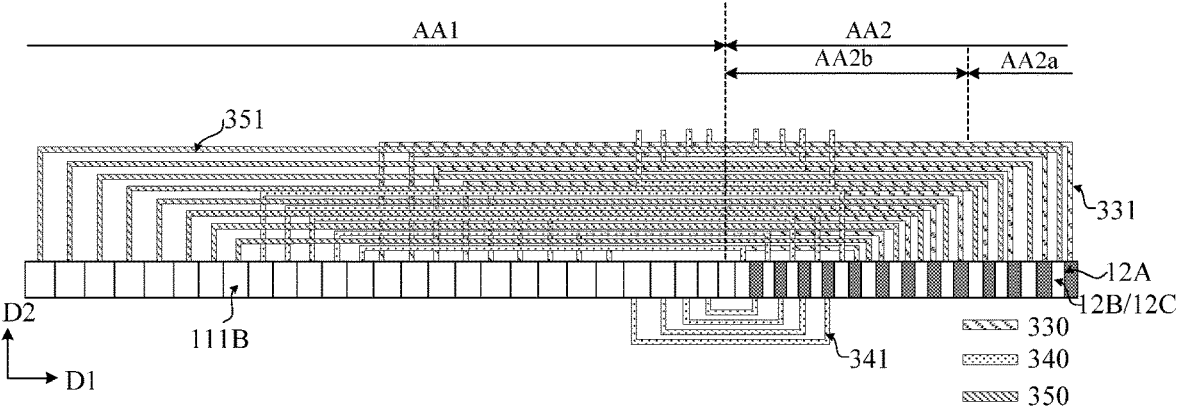
FIG. 8A is another schematic diagram of connection between a second light emitting device and a second pixel drive circuit according to at least one embodiment of the present disclosure.
Figure 8B:
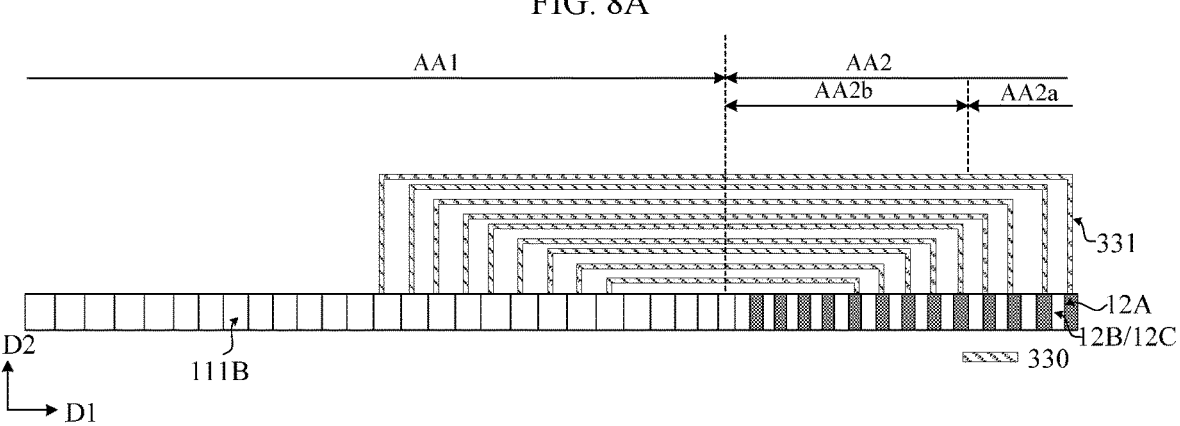
FIG. 8B is a schematic diagram of connection of a first transparent conductive line of a first transparent conductive layer in FIG. 8A.
Figure 8C:
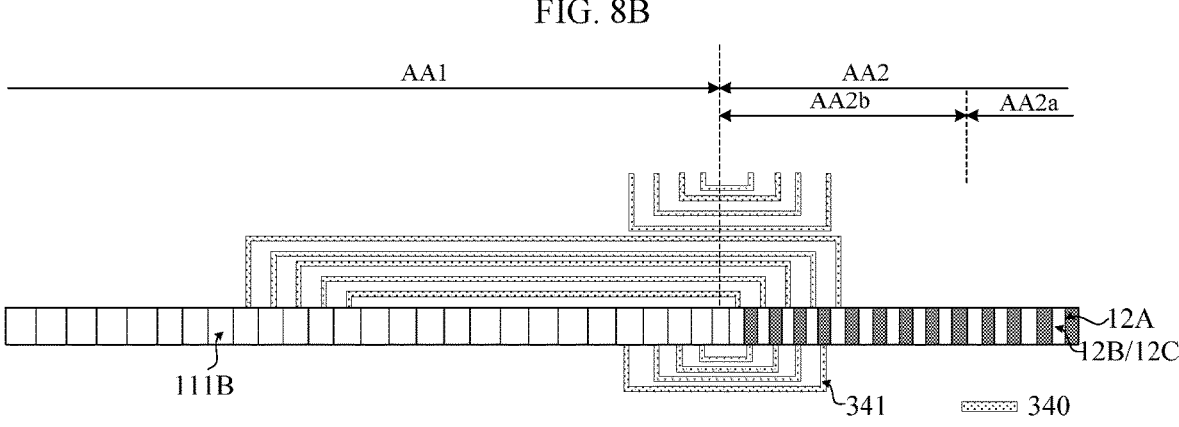
FIG. 8C is a schematic diagram of connection of a second transparent conductive line of a second transparent conductive layer in FIG. 8A.
Figure 8D:
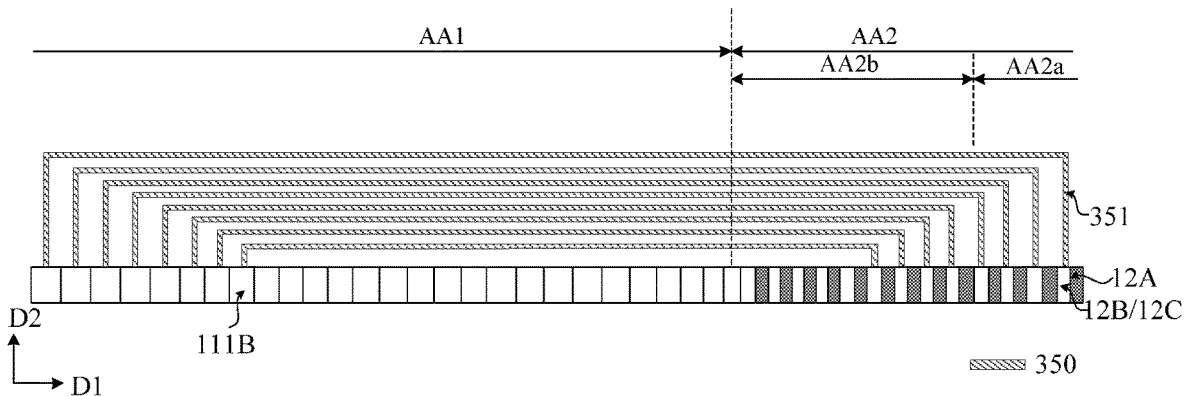
FIG. 8D is a schematic diagram of connection of a third transparent conductive line of a third transparent conductive layer in FIG. 8A.

FIG. 8A is another schematic diagram of connection between a second light emitting device and a second pixel drive circuit according to at least one embodiment of the present disclosure. FIG. 8B is a schematic diagram of connection of a first transparent conductive line of a first transparent conductive layer in FIG. 8A. FIG. 8C is a schematic diagram of connection of a second transparent conductive line of a second transparent conductive layer in FIG. 8A. FIG. 8D is a schematic diagram of connection of a third transparent conductive line of a third transparent conductive layer in FIG. 8A.

In some examples, as shown in FIGS. 8A to 8D, the second region AA2 may be divided into a first sub-region AA2*a* and a second sub-region AA2*b*. The second sub-region AA2*b* may surround the first sub-region A22*a* and be adjacent to the first region AA1. In a set of second light emitting devices, the number of second light emitting devices emitting green light in the first sub-region AA2*a* may be less than or equal to the number of second light emitting devices emitting green light in the second sub-region AA2*b*.

In some examples, as shown in FIGS. 8A and 8B, in at least one set of second light emitting devices in the second region, multiple second light emitting devices emitting green light 12A near an edge of the second region AA2 may be electrically connected to multiple second pixel drive circuits 111B in the first region AA1 through a second transparent conductive line 341 of the second transparent conductive layer 340, multiple second light emitting devices emitting green light 12A near a center of the second region AA2 may be electrically connected to multiple second pixel drive circuits 111B of the first region AA1 through a first transparent conductive line 331 of the first transparent conductive layer 330. Among them, a portion of the second light emitting devices emitting green light 12A in the second sub-region AA2*b* of the second region AA2 near the first region AA1 may be electrically connected to a second pixel drive circuit 111B in the first region AA1 through a second transparent conductive line 341 located in the second transparent conductive layer 340, a portion of the second light emitting devices emitting green light 12A in the second sub-region AA2*b* away from the first region AA1 may be electrically connected to a second pixel drive circuit 111B through a first transparent conductive line 331 located in the first transparent conductive layer 330. The second light emitting devices emitting green light 12A in the first sub-region AA2*a* of the second region AA2 may be electrically connected to a second pixel drive circuit 111B through a first transparent conductive line 331 located in the first transparent conductive layer 330. The second transparent conductive line 341 and the first transparent conductive line 331 to which the second light emitting devices emitting green light 12A in the second region AA2 are electrically connected may be located on opposite sides of the set of second light emitting devices in the second direction D2, for example, the first transparent conductive line 331 may be located on an upper side and the second transparent conductive line 341 may be located on a lower side.

In some examples, as shown in FIGS. 8A and 8D, in at least one set of second light emitting devices of the second region AA2, multiple second light emitting devices emitting blue light 12B and second light emitting devices emitting red light 12C near an edge of the second region AA2 may be electrically connected to multiple second pixel drive circuits 111B of the first region AA1 through a second transparent conductive line 341 of the second transparent conductive layer 340. Multiple second light emitting devices emitting blue light 12B and second light emitting devices emitting red light 12C near a center of the second region A2 may be electrically connected to multiple second pixel drive circuits 111B of the first region AA1 through a third transparent conductive line 351 of the third transparent conductive layer 350. The second light emitting devices emitting blue light 12B and the second light emitting devices emitting red light 12C in the second sub-region AA2*b* of the second region AA2 near the first region AA1 may be electrically connected to a second pixel drive circuit 111B through a second transparent conductive line 341 located in the second transparent conductive layer 340. The second light emitting devices emitting blue light 12B and the second light emitting devices emitting red light 12C away from the first region AA1 may be electrically connected to a second pixel drive circuit 111B through a third transparent conductive line 351 located in the third transparent conductive layer 350. The second light emitting devices emitting blue light 12B and the second light emitting devices emitting red light 12C in the first sub-region AA2a may be electrically connected to a second pixel drive circuit 111B through a third transparent conductive line 351 located in the third transparent conductive layer 350. In the second region A2, the second transparent conductive lines 341 and the third transparent conductive lines 351 to which the second light emitting devices emitting blue light 12B are electrically connected may be located on a same side of the set of second light emitting devices in the second direction D2, for example, the second transparent conductive lines 341 may be located on a lower side and the third transparent conductive lines 351 may be located on an upper side. The second transparent conductive lines 341 and the third transparent conductive lines 351 to which the second light emitting devices emitting red light 12C are electrically connected may be located on a same side of the set of second light emitting devices in the second direction D2, for example, the second transparent conductive lines 341 may be located on the lower side and the third transparent conductive lines 351 may be located on the upper side.

Figure 9:
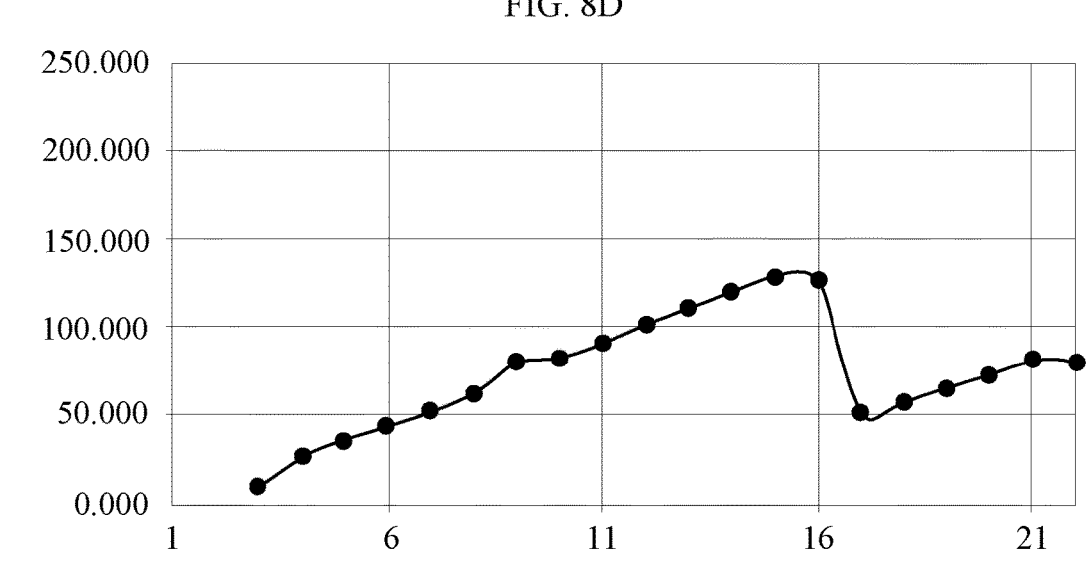
FIG. 9 is a schematic diagram of a parasitic capacitance between an anode connection node of a second light emitting device emitting green light and an anode connection node of a second light emitting device emitting blue light or red light of a display panel shown in FIG. 8A.

FIG. 9 is a schematic diagram of a parasitic capacitance between an anode connection node of a second light emitting device emitting green light and an anode connection node of a second light emitting device emitting blue light or red light of the display panel shown in FIG. 8A. In FIG. 9, the abscissa indicates a position of a second light emitting device emitting green light from an edge of the second region to a center of the second region in the first direction, and the ordinate indicates a parasitic capacitance between the anode connection node of the second light emitting device emitting green light and the anode connection node of the second light emitting device emitting blue light or red light. In this example, a boundary between the first sub-region and the second sub-region may be between positions of the 15th and 16th second light emitting devices emitting green light. As shown in FIGS. 8A and 9, in the first sub-region AA2a, the second light emitting devices emitting green light 12A are electrically connected to a first transparent conductive line located in the first transparent conductive layer. The second light emitting devices emitting blue light 12B and the second light emitting devices emitting red light 12C are electrically connected to a third transparent conductive line located in the third transparent conductive layer. A parasitic capacitance between the first transparent conductive layer and the third transparent conductive layer is smaller, and crosstalk between the anode connection node of the second light emitting device emitting green light and the anode connection node of the second light emitting device emitting blue light or red light may be reduced. As shown in FIG. 9, each parasitic capacitance between multiple second light emitting devices emitting green light 12A (e.g. sixteenth to twenty-second second light emitting devices emitting green light) and anode connection nodes of second light emitting devices emitting blue light 12B and second light emitting devices emitting red light 12C in the first sub-region AA2a of this example may be less than a maximum parasitic capacitance between a second light emitting device emitting green light 12A and an anode connection node of a second light emitting device emitting blue light 12B and a second light emitting device emitting red light 12C in the second sub-region AA2b (for example, the parasitic capacitance between the fifteenth second light emitting device emitting green light and the anode connection nodes of light emitting devices of other colors).

Figure 10A:
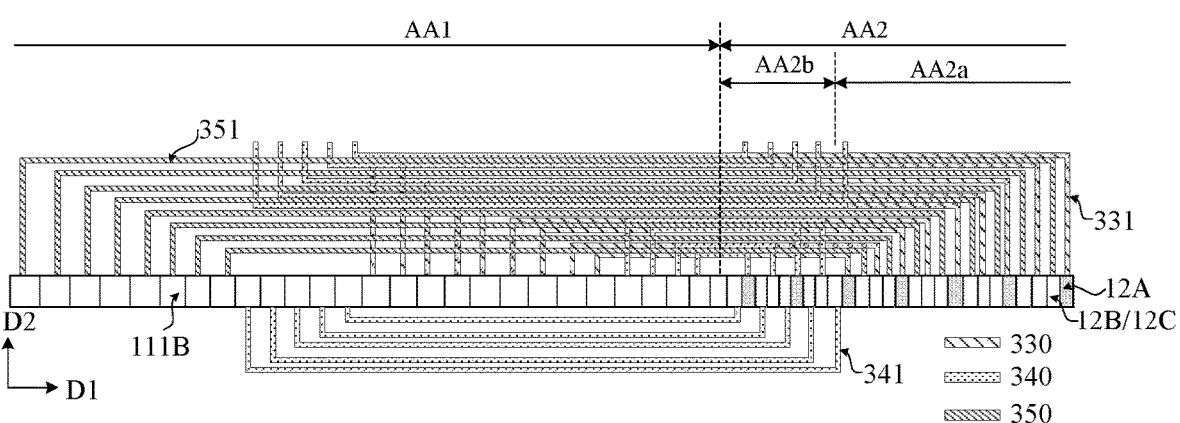
FIG. 10A is another schematic diagram of connection between a second light emitting device and a second pixel drive circuit according to at least one embodiment of the present disclosure.
Figure 10B:
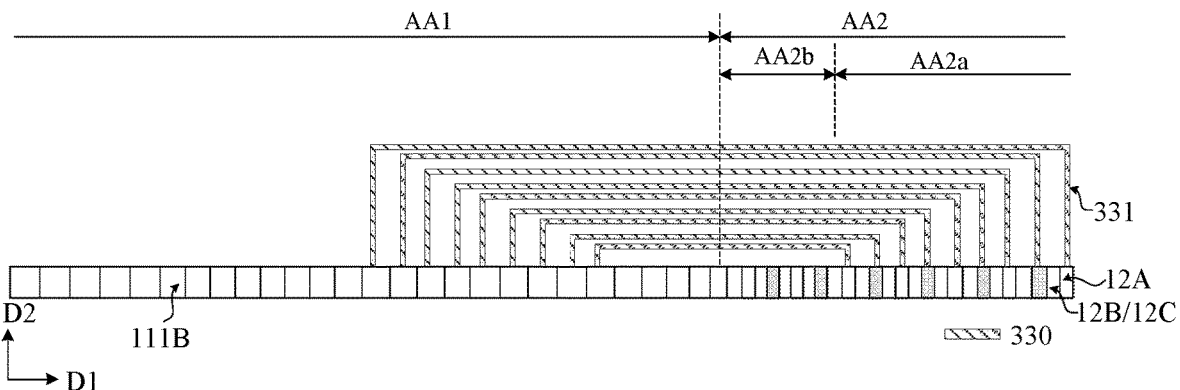
FIG. 10B is a schematic diagram of connection of a first transparent conductive line of a first transparent conductive layer in FIG. 10A.
Figure 10C:
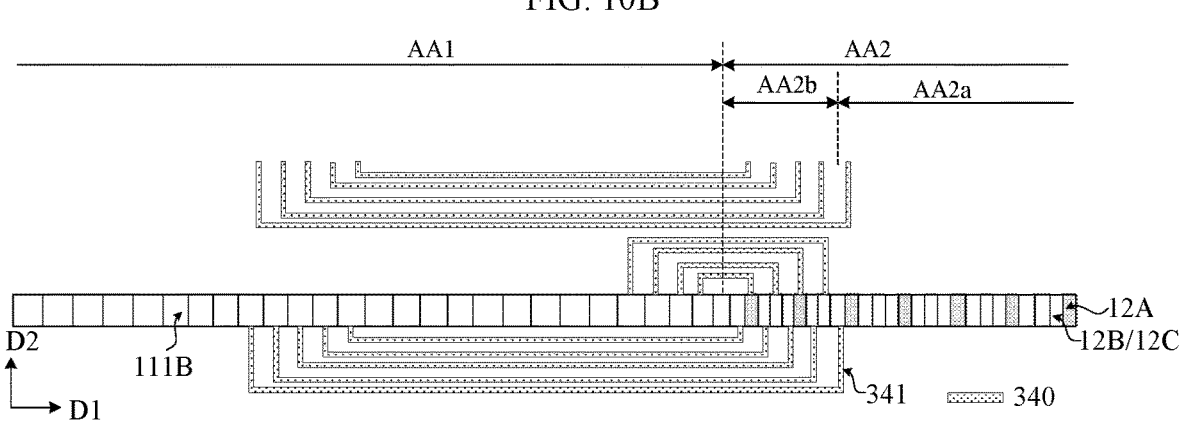
FIG. 10C is a schematic diagram of connection of a second transparent conductive line of a second transparent conductive layer in FIG. 10A.
Figure 10D:
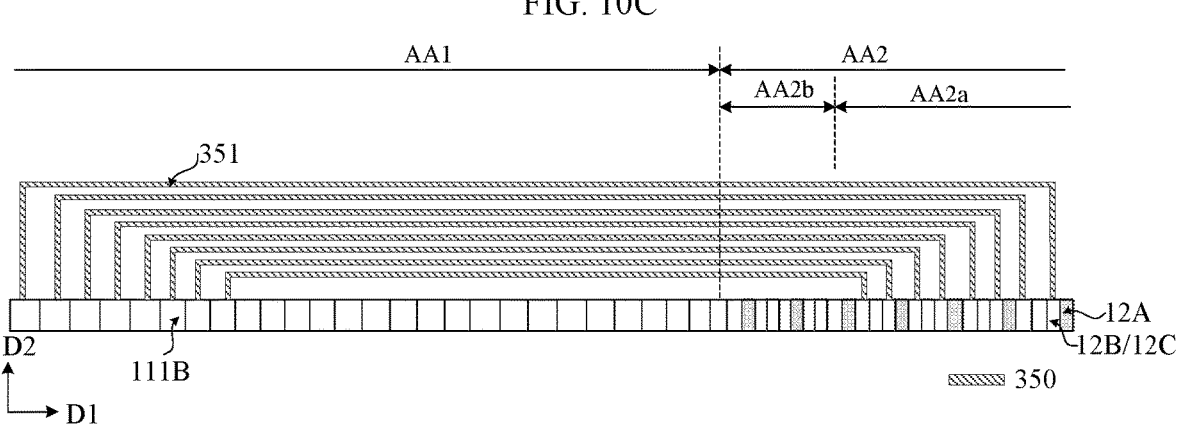
FIG. 10D is a schematic diagram of connection of a third transparent conductive line of a third transparent conductive layer in FIG. 10A.

FIG. 10A is another schematic diagram of connection between a second light emitting device and a second pixel drive circuit according to at least one embodiment of the present disclosure. FIG. 10B is a schematic diagram of connection of a first transparent conductive line of a first transparent conductive layer in FIG. 10A. FIG. 10C is a schematic diagram of connection of a second transparent conductive line of a second transparent conductive layer in FIG. 10A. FIG. 10D is a schematic diagram of connection of a third transparent conductive line of a third transparent conductive layer in FIG. 10A.

In some examples, as shown in FIGS. 10A to 10D, the second region AA2 may be divided into a first sub-region AA2a and a second sub-region AA2b. The second sub-region AA2b may surround the first sub-region A22a and be adjacent to the first region AA1. In a set of second light emitting devices, the number of second light emitting devices emitting green light in the first sub-region AA2a may be greater than the number of second light emitting devices emitting green light in the second sub-region AA2a.

In some examples, as shown in FIGS. 10A to 10C, the second light emitting devices emitting green light 12A in the second sub-region AA2b of the second region AA2 may be electrically connected to a second pixel drive circuit 111B in the first region AA1 through a second transparent conductive line 341 located in the second transparent conductive layer 340. The second light emitting devices emitting green light 12A in the first sub-region A2a may be electrically connected to a second pixel drive circuit 111B in the first region AA1 through a first transparent conductive line 331 of the first transparent conductive layer 330. Among them, the second transparent conductive line 341 and the first transparent conductive line 331 to which the second light emitting devices emitting green light 12A of the second region AA2 are electrically connected may be located on a same side of the set of second light emitting devices in the second direction D2, for example, they may be located on an upper side.

In some examples, as shown in FIGS. 10A to 10D, the second light emitting devices emitting blue light 12B and the second light emitting devices emitting red light 12C in the second sub-region AA2b of the second region AA2 may be electrically connected to a second pixel drive circuit 111B in the first region AA1 through a second transparent conductive line 341 located in the second transparent conductive layer 340. The second light emitting devices emitting blue light 12B and the second light emitting devices emitting red light 12C in the first sub-region AA2a may be electrically connected to a second pixel drive circuit 111B in the first region AA1 through a third transparent conductive line 351 located in the third transparent conductive layer 350. The second transparent conductive line 341 and the third transparent conductive line 351 to which the light emitting devices emitting blue light 12B of the second region AA2 are electrically connected may be located on opposite sides of the set of second light emitting devices in the second direction D2, for example, the second transparent conductive line 341 may be located on the lower side and the third transparent conductive line 351 may be located on the upper side. The second transparent conductive line 341 and the third transparent conductive line 351 to which the second light emitting devices emitting red light 12C of the second region AA2 are electrically connected may be located on opposite sides of the set of second light emitting devices in the second direction D2, for example, the second transparent conductive line 341 may be located on the lower side and the third transparent conductive line 351 may be located on the upper side. The third transparent conductive line 351 to which the second light emitting device emitting blue light 12B and the second light emitting device emitting red light 12C are electrically connected and the first transparent conductive line 331 to which the second light emitting device emitting green light 12A is electrically connected may be located on a same side of the set of second light emitting devices in the second direction D2.

Figure 11:
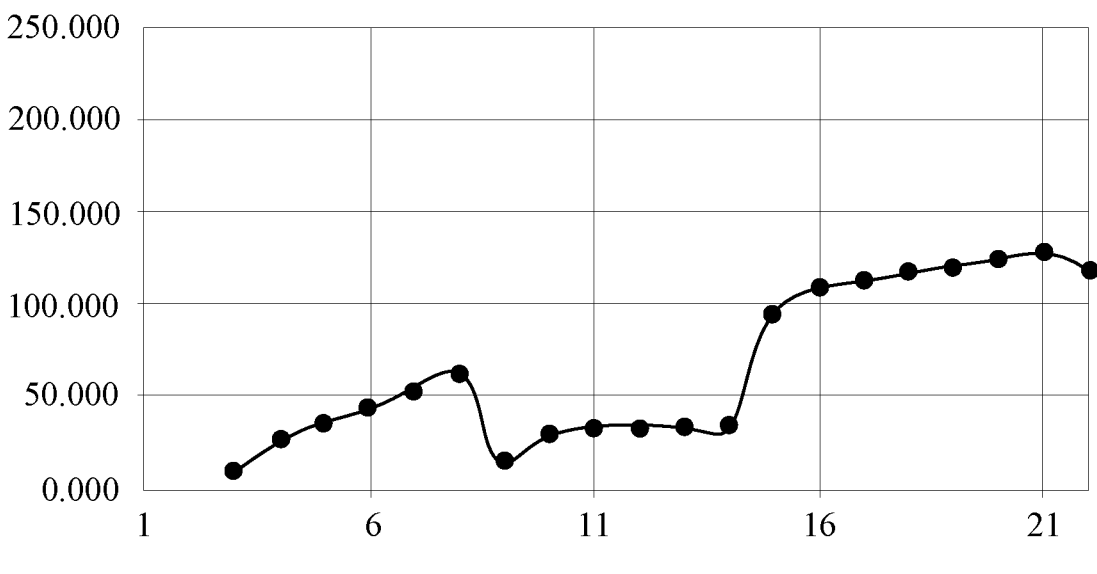
FIG. 11 is a schematic diagram of a parasitic capacitance between an anode connection node of a second light emitting device emitting green light and an anode connection node of a second light emitting device emitting blue light or red light of a display panel shown in FIG. 10A.

FIG. 11 is a schematic diagram of a parasitic capacitance between an anode connection node of a second light emitting device emitting green light and an anode connection node of second light emitting device emitting blue light or red light of the display panel shown in FIG. 10A. In FIG. 11, the abscissa indicates a position of a second light emitting device emitting green light from an edge of the second region to a center of the second region in the first direction, and the ordinate indicates a parasitic capacitance between the anode connection node of the second light emitting device emitting green light and the anode connection node of the second light emitting device emitting blue light or red light. In this example, a boundary between the first sub-region and the second sub-region may be between positions of the eighth and ninth second light emitting devices emitting green light. As shown in FIGS. 10A and 11, in the first sub-region AA2a, the second light emitting device emitting green light 12A is electrically connected to a first transparent conductive line located in the first transparent conductive layer. The second light emitting device emitting blue light 12B and the second light emitting device emitting red light 12C are electrically connected to a third transparent conductive line located in the third transparent conductive layer, so that crosstalk between the anode connection node of the second light emitting device emitting green light and the anode connection node of the second light emitting device emitting blue light or red light may be reduced to a certain extent, thereby improving the display effect. As shown in FIG. 11, each of the parasitic capacitance between multiple second light emitting devices emitting green light 12A (e.g. ninth to fourteenth second light emitting devices emitting green light) and anode connection nodes of second light emitting devices emitting blue light 12B and second light emitting devices emitting red light 12C in the first sub-region AA2a of this example may be less than a maximum parasitic capacitance between a second light emitting device emitting green light 12A and an anode connection node of a second light emitting device emitting blue light 12B and a second light emitting device emitting red light 12C in the second sub-region AA2b (for example, the parasitic capacitance between the eighth second light emitting device emitting green light and the anode connection nodes of light emitting devices of other colors).

In some exemplary embodiments, in the examples shown in FIGS. 6A, 8A, and 10A, the crosstalk between the anode connection nodes of the second light emitting device emitting green light and the second light emitting devices emitting blue light and red light in the second sub-region AA2b is small, and in the example shown in FIGS. 8A and 10A, the crosstalk between the anode connection nodes of the second light emitting devices emitting green light and the second light emitting devices emitting blue light and red light in the first sub-region AA2a can also be improved. The display panel provided by the embodiment can improve the crosstalk between the anode connection nodes of the second light emitting device emitting green light and the second light emitting devices emitting blue light and red light in the second region, thereby improving the display effect of the second region.

Figure 12:
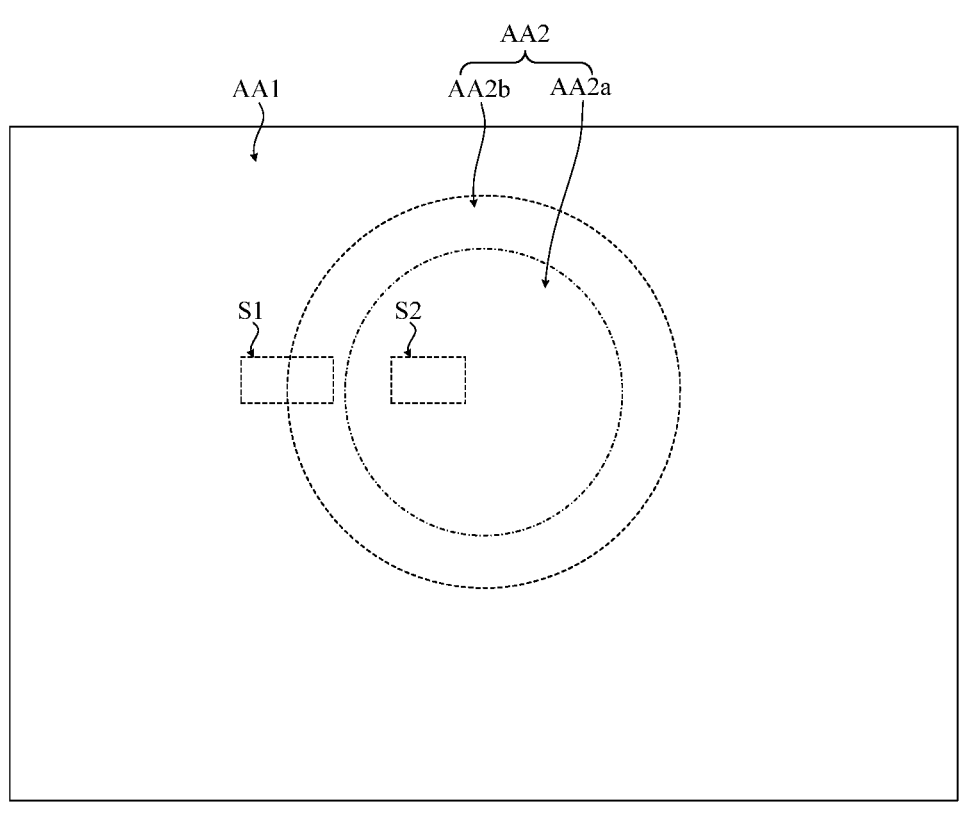
FIG. 12 is a partial schematic view of a display panel according to at least one embodiment of the present disclosure.

FIG. 12 is a partial schematic view of a display panel according to at least one embodiment of the present disclosure. In some exemplary embodiments, as shown in FIG. 12, the second region AA2 may be divided into a first sub-region AA2a and a second sub-region AA2b. The second sub-region AA2b may surround the first sub-region A22a and be adjacent to the first region AA1. The first sub-region AA2a may be a central region of the second region AA2, and the second sub-region AA2b may be an edge region of the second region AA2. A film layer structure of the display panel of the present embodiment will be described below with a wiring example shown in FIG. 10A.

Figure 13A:
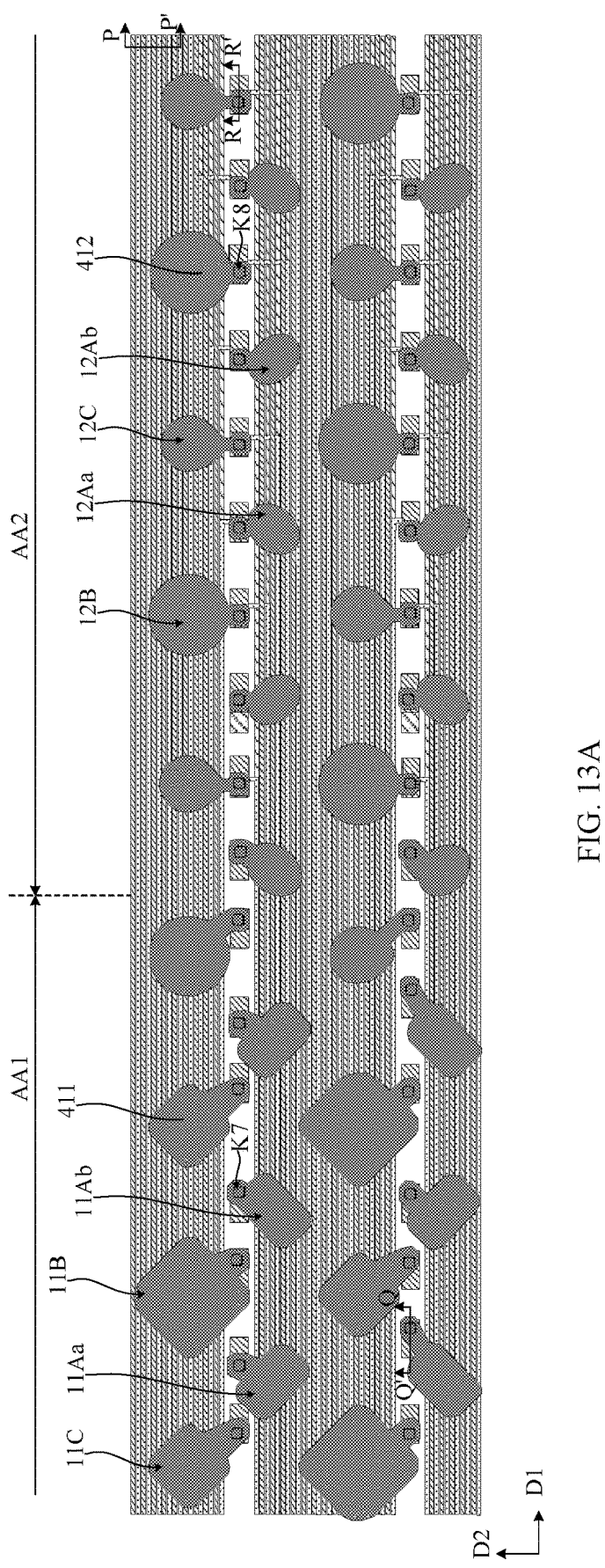
FIG. 13A is a schematic partial top view of region S1 in FIG. 12.
Figure 13B:
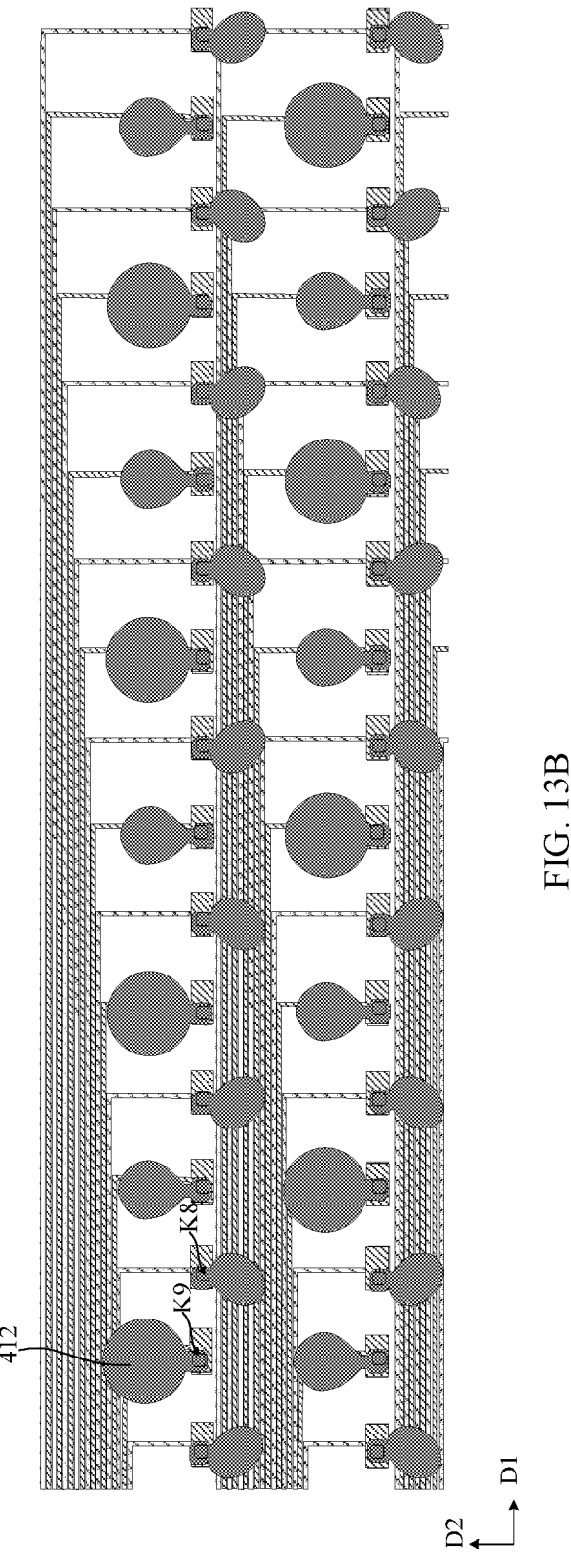
FIG. 13B is a schematic partial top view of region S2 in FIG. 12.
Figure 14A:
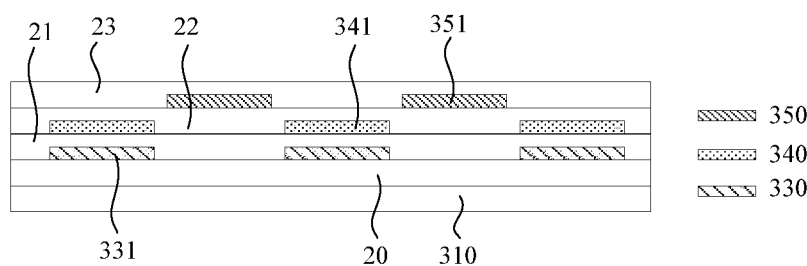
FIG. 14A is a schematic partial sectional view along a P-P' direction in FIG. 13A.
Figure 14B:
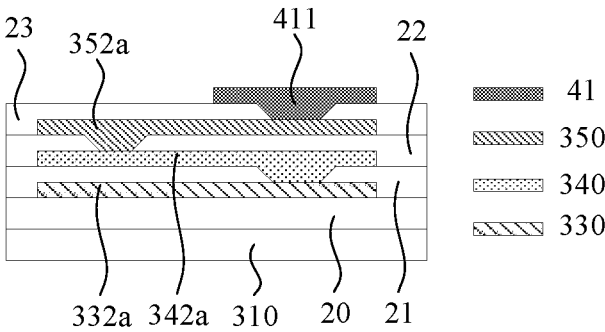
FIG. 14B is a schematic partial sectional view along a Q-Q' direction in FIG. 13A.
Figure 14C:
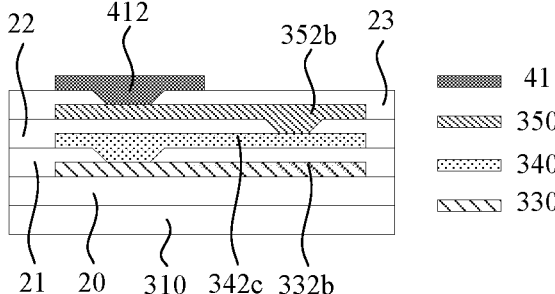
FIG. 14C is a schematic partial sectional view along an R-R' direction in FIG. 13A.

FIG. 13A is a schematic partial top view of region S1 in FIG. 12. FIG. 13B is a schematic partial top view of region S2 in FIG. 12. FIG. 14A is a partial sectional schematic diagram along a P-P' direction in FIG. 13A. FIG. 14B is a schematic partial sectional view along a Q-Q' direction in FIG. 13A. FIG. 14C is a schematic partial sectional view along an R-R' direction in FIG. 13A.

In some examples, as shown in FIG. 13A, multiple first light emitting devices of the first region AA1 may include multiple first light emitting devices emitting green light 11Aa and 11Ab, multiple first light emitting devices emitting blue light 11B, and multiple first light emitting devices emitting red light 11C. At least one pixel unit may include one first light emitting device emitting blue light 11B, one first light emitting device emitting red light 11C, one first light emitting device emitting green light 11Aa, and one first light emitting device emitting green light 11Ab. The first light emitting device emitting blue light 11B and the first light emitting device emitting red light 11C may be arranged at an interval along the first direction D1 and the second direction D2, respectively, and the first light emitting device emitting green light 11Aa and the first light emitting device emitting green light 11Ab may be arranged at an interval along the first direction D1 and the second direction D2. There is a dislocation between a row where the first light emitting device emitting blue light 11B and the first light emitting device emitting red light 11C are located and a row where the first light emitting devices emitting green light 11Aa and 11Ab are located, and there is also a dislocation between a column where the first light emitting device emitting blue light 11B and the first light emitting device emitting red light 11C are located and a column where the first light emitting devices emitting green light 11Aa and 11Ab are located. In some examples, shapes and sizes of the first light emitting devices emitting green light 11Aa and 11Ab may be substantially the same, for example, the first light emitting devices emitting green light 11Aa and 11Ab may be substantially rectangular. The first light emitting device emitting blue light 11B and the first light emitting device emitting red light 11C may be substantially rectangular, and the first light emitting device emitting blue light 11B may be larger than the first light emitting device emitting red light 11B.

In some examples, as shown in FIGS. 13A and 13B, the multiple second light emitting devices of the second region AA2 may include multiple second light emitting devices emitting green light 12Aa and 12Ab, multiple second light emitting devices emitting blue light 12B, and multiple second light emitting devices emitting red light 12C. At least one pixel unit may include one second light emitting device emitting blue light 12B, one second light emitting device emitting red light 12C, one second light emitting device emitting green light 12Aa, and one second light emitting device emitting green light 12Ab. Arrangement of the second light emitting device emitting blue light 12B, the second light emitting device emitting red light 12C, and the second light emitting devices emitting green light 12Aa and 12Ab may be substantially the same as the arrangement of the first light emitting device emitting blue light 11B, the first light emitting device emitting red light 11C, and the first light emitting devices emitting green light 11Aa and 11Ab, and therefore the details will not be repeated here.

In some examples, an area of an anode 412 of a second light emitting device may be smaller than an area of an anode 411 of a first light emitting device that emits light of a same color. For example, an orthographic projection of an anode of each of the second light emitting devices emitting green light 12Aa and 12Ab on the base substrate may be approximately in a combined shape of an elliptical body and a rectangular connection block. An orthographic projection of the anode of the second light emitting device emitting blue light 12B on the base substrate may be approximately in a combined shape of a circular body and a rectangular connection block, which is similar to a shape of a hot air balloon. An orthographic projection of an anode of a second light emitting device emitting red light 12C on the base substrate may be approximately in a shape of a combination of an elliptical body and a rectangular connection block, which is similar to a shape of a water droplet. In this example, by smoothing the corners of the anodes of the second light emitting devices in the second region in design, it is conducive to reducing diffraction of a sensor (for example, a camera sensor) under the second region of the display panel when shooting, thereby improving the shooting effect.

In some examples, as shown in FIG. 13A, shape and size of an anode of at least one first light emitting device in the edge region of the first region AA1 near the second region AA2 may be substantially the same as shape and size of an anode of a second light emitting device emitting light of a same color in the second region AA2.

In some examples, as shown in FIGS. 14A and 14C, in a direction perpendicular to the display panel, in the first region AA1 and the second region AA2, the display panel may include a base substrate 310, a circuit structure layer 20 disposed on the base substrate 310, a first transparent conductive layer 330, a second transparent conductive layer 340, a third transparent conductive layer 350, and a light emitting structure layer. The circuit structure layer 20 of the first region AA1 may include multiple pixel drive circuits. The circuit structure layer 20 of the second region AA2 may include multiple insulating layers which are stacked. A first planarization layer 21 may be disposed between the first transparent conductive layer 330 and the second transparent conductive layer 340, and a second planarization layer 22 may be disposed between the second transparent conductive layer 340 and the third transparent conductive layer 350. A third planarization layer 23 may be provided between the third transparent conductive layer 350 and the light emitting structure layer. The light emitting structure layer may include an anode layer 41, a pixel define layer, an organic light emitting layer, and a cathode. The first planarization layer and the third planarization layer may be organic material layers. However, this embodiment is not limited thereto. In some other examples, the display panel may include two or more transparent conductive layers.

Figures 15A, 15B:
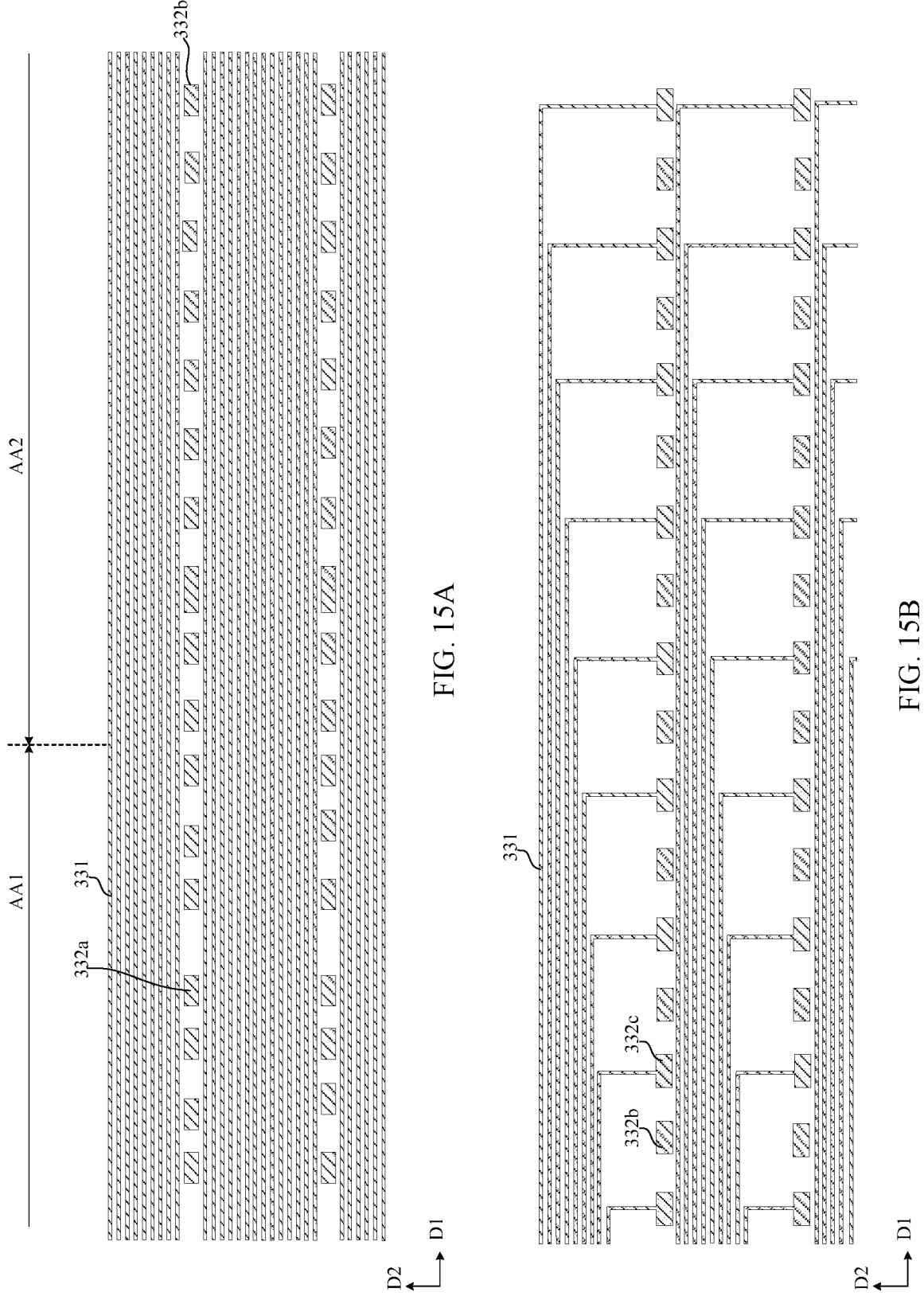
FIG. 15A is a schematic top view of a display panel after a first transparent conductive layer is formed in FIG. 13A.
FIG. 15B is a schematic top view of a display panel after a first transparent conductive layer is formed in FIG. 13B.
Figures 16A, 16B:
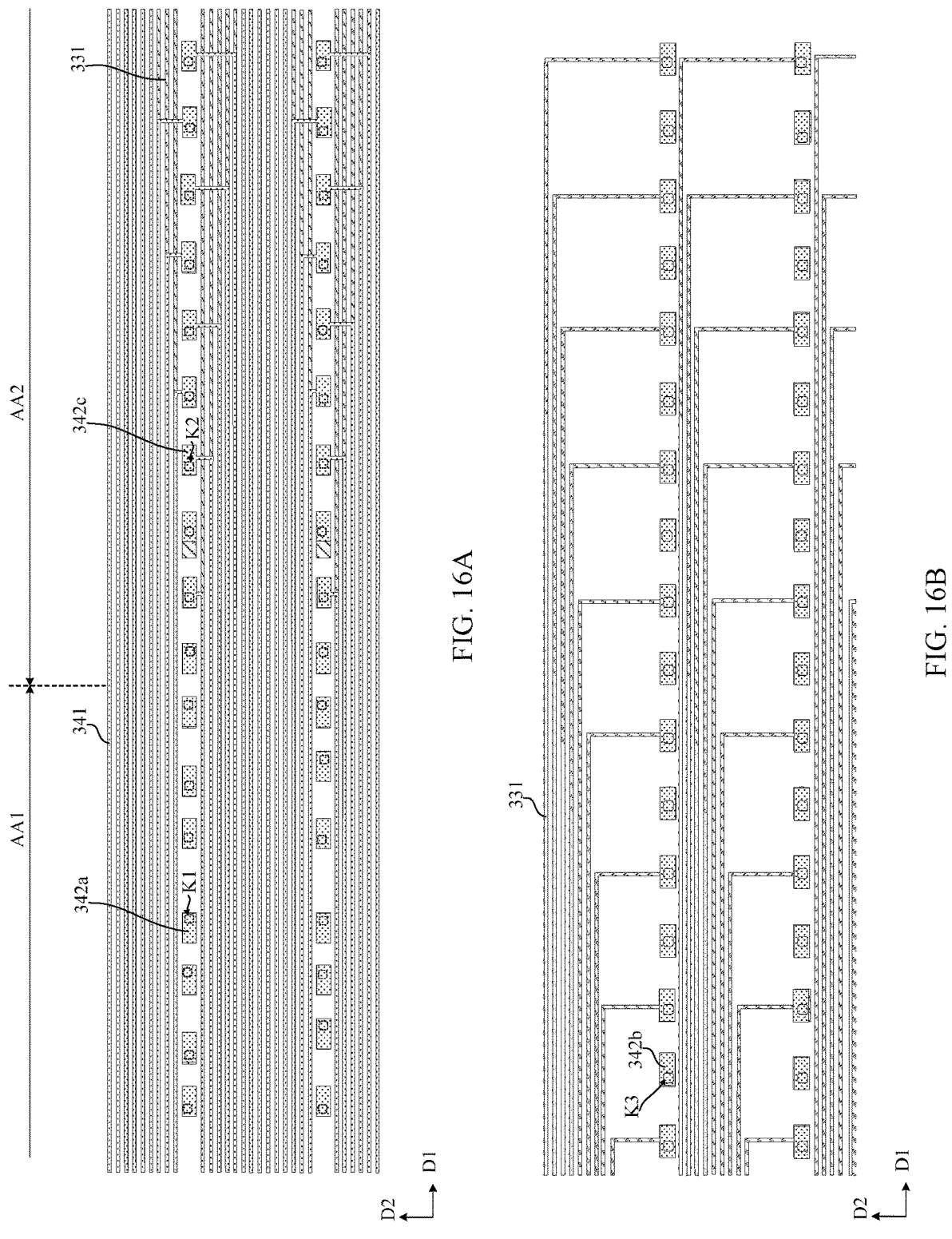
FIG. 16A is a schematic top view of a display panel after a second transparent conductive layer is formed in FIG. 13A.
FIG. 16B is a schematic top view of a display panel after a second transparent conductive layer is formed in FIG. 13B.

FIG. 15A is a schematic top view of the display panel after a first transparent conductive layer is formed in FIG. 13A. FIG. 15B is a schematic top view of a display panel after a first transparent conductive layer is formed in FIG. 13B. FIG. 16A is a schematic top view of a display panel after a second transparent conductive layer is formed in FIG. 13A.

Figures 17A, 17B:
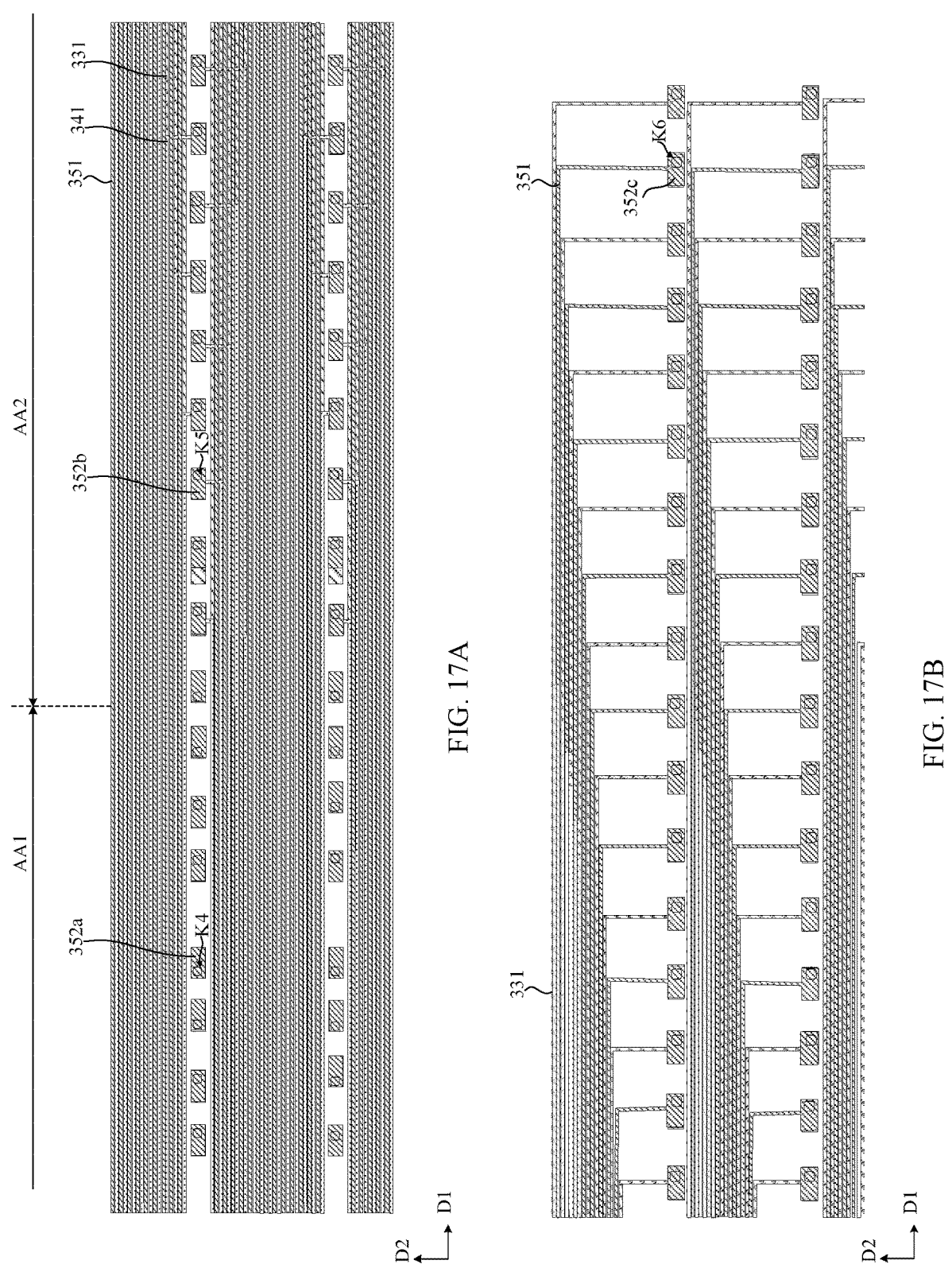
FIG. 17A is a schematic top view of a display panel after a third transparent conductive layer is formed in FIG. 13A.
FIG. 17B is a schematic top view of a display panel after a third transparent conductive layer is formed in FIG. 13B.

FIG. 16B is a schematic top view of a display panel after a second transparent conductive layer is formed in FIG. 13B. FIG. 17A is a schematic top view of a display panel after a third transparent conductive layer is formed in FIG. 13A. FIG. 17B is a schematic top view of a display panel after a third transparent conductive layer is formed in FIG. 13B.

In some examples, as shown in FIGS. 15A and 15B, the first transparent conductive layer 330 may include multiple first transparent conductive lines 331, multiple first anode connection electrodes 332a, and multiple second anode connection electrodes 332b and 332c. The multiple first transparent conductive lines 331 may extend from the first region AA1 to the second region AA2. The multiple first anode connection electrodes 332a may be located in the first region AA1, and the multiple second anode connection electrodes 332b and 332c may be located in the second region AA2. Among them, a second anode connection electrode 332c and a first transparent conductive line 331 may be electrically connected, for example, in an integral structure.

In some examples, as shown in FIGS. 16A and 16B, the second transparent conductive layer 340 may include multiple second transparent conductive lines 341, multiple third anode connection electrodes 342a, and multiple fourth anode connection electrodes 342b and 342c. The multiple second transparent conductive lines 341 may extend from the first region AA1 to the second region AA2. The multiple third anode connection electrodes 342a may be located in the first region AA1, and the multiple fourth anode connection electrodes 342b and 342c may be located in the second region AA2. A fourth anode connection electrode 342c and a second transparent conductive line 341 may be electrically connected, for example, in an integral structure.

In some examples, as shown in FIGS. 17A and 17B, the third transparent conductive layer 350 may include multiple third transparent conductive lines 351, multiple fifth anode connection electrodes 352a, and multiple sixth anode connection electrodes 352b and 352c. The multiple third transparent conductive lines 351 may extend from the first region AA1 to the second region AA2. The multiple fifth anode connection electrodes 352a may be located in the first region AA1, and the multiple sixth anode connection electrodes 352b and 352c may be located in the second region AA2. A third transparent conductive line 351 and a sixth anode connection electrode 352c may be electrically connected, for example, in an integral structure.

In some examples, as shown in FIGS. 13A to 17B, there may be an overlap between an orthographic projection of a portion of the second transparent conductive line 341 extending in the first direction D1 on the base substrate and an orthographic projection of a portion of the first transparent conductive line 331 extending in the first direction D1 on the base substrate. For example, there may be an overlap between an orthographic projection of a portion of the second transparent conductive line 341 extending in the first direction D1 on the base substrate and an orthographic projection of a portion of the first transparent conductive line 331 extending in the first direction D1 on the base substrate. That is, portions of the first transparent conductive line 331 and the second transparent conductive line 341 extending in the first direction D1 may have substantially a same length in the second direction D2. However, this embodiment is not limited thereto.

In some examples, as shown in FIGS. 13A to 17B, there may be no overlap between an orthographic projection of a portion of the third transparent conductive line 351 extending in the first direction D1 on the base substrate and an orthographic projection of a portion of the first transparent conductive line 331 and a portion of the second transparent conductive line 341 extending in the first direction D1 on the base substrate. As shown in FIG. 14A, an orthographic projection of a portion of the third transparent conductive line 351 extending in the first direction D1 on the base substrate may be located between orthographic projections of portions of two adjacent second transparent conductive lines 341 extending in the first direction D1 on the base substrate. However, this embodiment is not limited thereto.

In some examples, as shown in FIGS. 13A and 13B, the anode layer 41 may include an anode 411 of a first light emitting device located in the first region AA1 and an anode 412 of a second light emitting device located in a second region AA2. In some examples, an area of the anode of the first light emitting device may be larger than an area of the anode of the second light emitting device that emits light of a same color to improve a light transmittance of the second region.

In some examples, as shown in FIG. 13A, the anode 411 of the first light emitting device of the first region AA1 may be electrically connected to a fifth anode connection electrode 352a of the third transparent conductive layer 350 through a via hole (e.g., a seventh via hole K7) formed on the third planarization layer 23. As shown in FIG. 17A, the fifth anode connection electrode 352a may be electrically connected to a third anode connection electrode 342a of the second transparent conductive layer 340 through a via hole (e.g., a fourth via hole K4) formed on the second planarization layer 22. As shown in FIGS. 16A and 15A, the third anode connection electrode 342a may be electrically connected to a first anode connection electrode 332a of the first transparent conductive layer 330 through a via hole (e.g., a first via hole K1) formed on the first planarization layer 21. The first anode connection electrode 332a may be electrically connected to the first pixel drive circuit of the circuit structure layer 20. In this example, the anode 411 of the first light emitting device of the first region AA1 may be electrically connected to the circuit structure layer through the anode connection electrodes located in the three transparent conductive layers. However, this embodiment is not limited thereto. In some other examples, the anode of the first light emitting device of the first region AA1 may be electrically connected to an anode connection electrode of a certain transparent conductive layer directly, and then electrically connected directly to a corresponding first pixel drive circuit by the anode connection electrode.

In some examples, as shown in FIGS. 13A and 13B, at least one anode 412 of the second region AA2 may be electrically connected to a sixth anode connection electrode 352b of the third transparent conductive layer 350 through a via hole (e.g., an eighth via hole K8) formed on the third planarization layer 23, or may be electrically connected to the sixth anode connection electrode 352c of the third transparent conductive layer 350 through a via hole (e.g., a ninth via hole K9) formed on the third planarization layer 23. The sixth anode connection electrode 352b may be electrically connected to the fourth anode connection electrode 342b or 342c of the second transparent conductive layer 340 through a via hole (e.g., a fifth via hole K5) formed on the second planarization layer 22. The sixth anode connection electrode 352c may be electrically connected to the fourth anode connection electrode 342b of the second transparent conductive layer 340 through a via hole (e.g., the sixth via hole K6) formed on the second planarization layer 22. The fourth anode connection electrode 342b may be electrically connected to the second anode connection electrode 332b or 332c of the first transparent conductive layer 330 through a via hole (e.g. a third via hole K3) formed on the first planarization layer 21. The fourth anode connection electrode 342c may be electrically connected to the second anode connection electrode 332b of the first transparent conductive layer 330 through a via hole (e.g. a second via hole K2) formed on the first planarization layer 21. In this example, the at least one anode 412 of a second light emitting device of the second region AA2 may be electrically connected to the second pixel drive circuit of the circuit structure layer through the anode connection electrodes located in the three transparent conductive layers. However, this embodiment is not limited thereto. In some other examples, the anode of the second light emitting device of the second region AA2 may be electrically connected to an anode connection electrode of a certain transparent conductive layer, and then electrically connected directly to the second pixel drive circuit of the circuit structure layer by the anode connection electrode. As another example, the anode of the second light emitting element of the second region AA2 may be directly electrically connected to the second pixel circuit.

Figure 18:
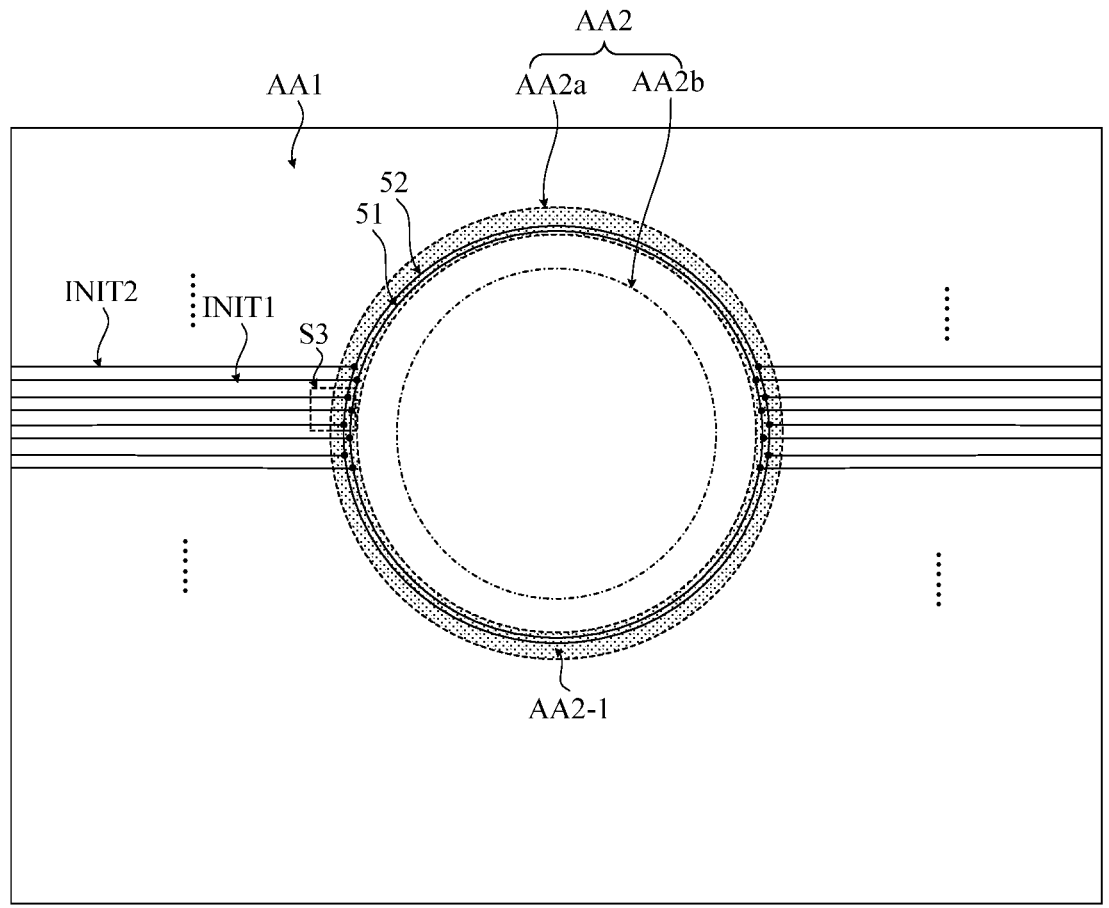
FIG. 18 is a partial schematic view of a display panel according to at least one embodiment of the present disclosure.

FIG. 18 is a partial schematic view of a display panel according to at least one embodiment of the present disclosure. In some examples, as shown in FIG. 18, the second sub-region AA2a of the second region AA2 may include a transition region AA2-1. The transition region AA2-1 may be provided with wirings and invalid pixel drive circuits. All regions in the second region AA2 except the transition region AA2-1 are light-transmissive regions. An orthographic projection of a photosensitive region of a sensor on a lower side of the display panel on the base substrate may be located in a light-transmissive region of the second region AA2. The light-transmissive region may be not provided with pixel drive circuits and metal wirings. The transition region AA2-1 may surround the light-transmissive region. In some examples, the transition region AA2-1 may be provided with a first connection line 51 and a second connection line 52. The first connection line 51 may be connected to a first initial signal line INIT1 cut off by the second region AA2, and the second connection line 52 may be connected to a second initial signal line INIT2 cut off by the second region AA2.

Figure 19:
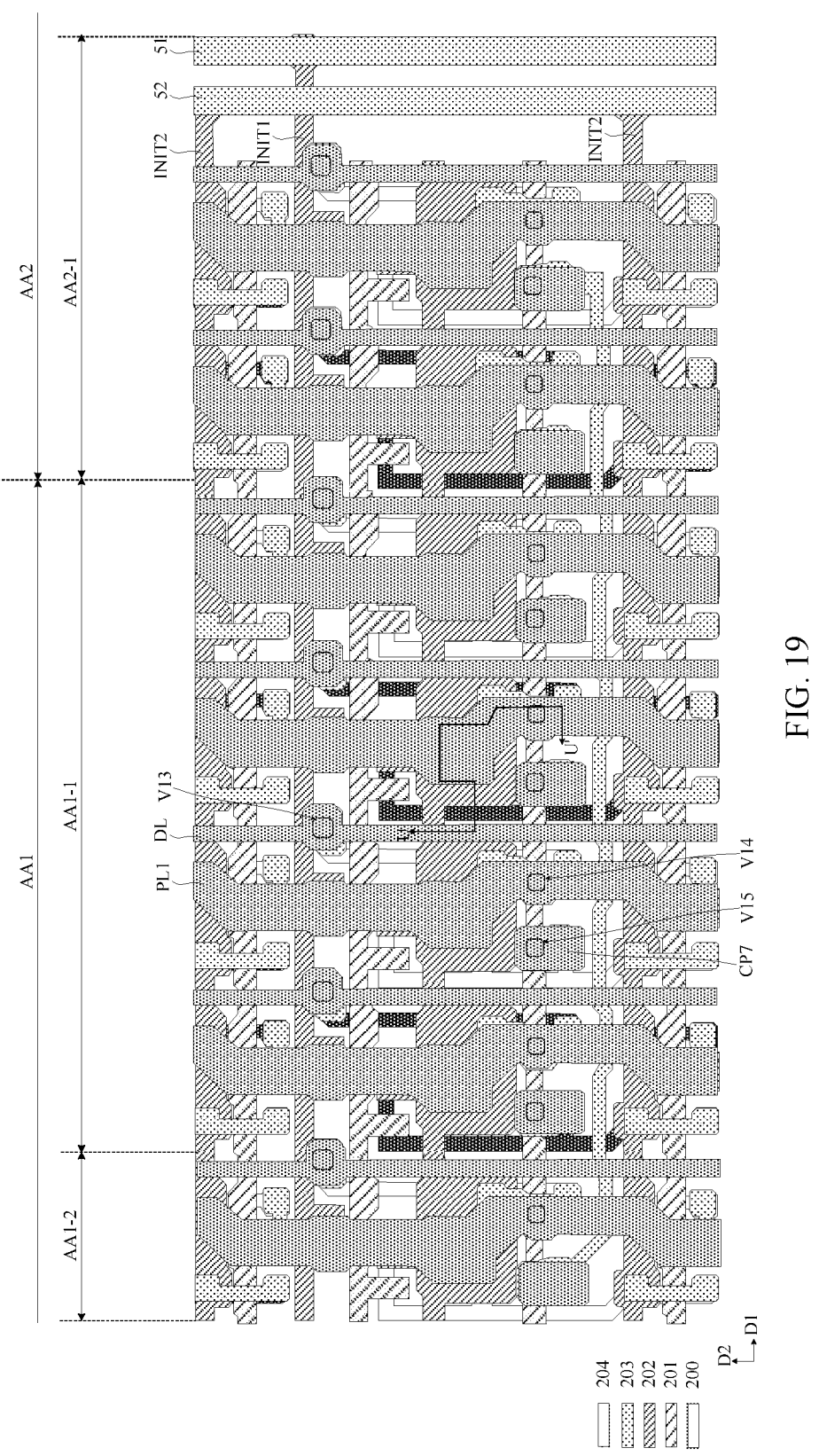
FIG. 19 is a schematic top view of a circuit structure layer in region S3 in FIG. 18.
Figure 20:
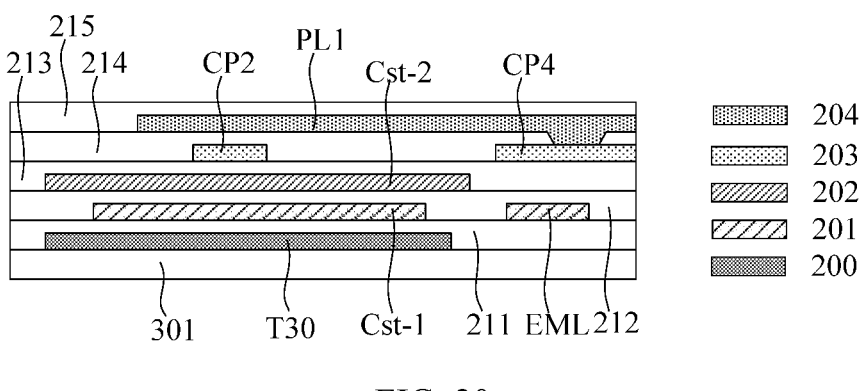
FIG. 20 is a partial sectional view along a U-U' direction in FIG. 19.
Figure 21A:
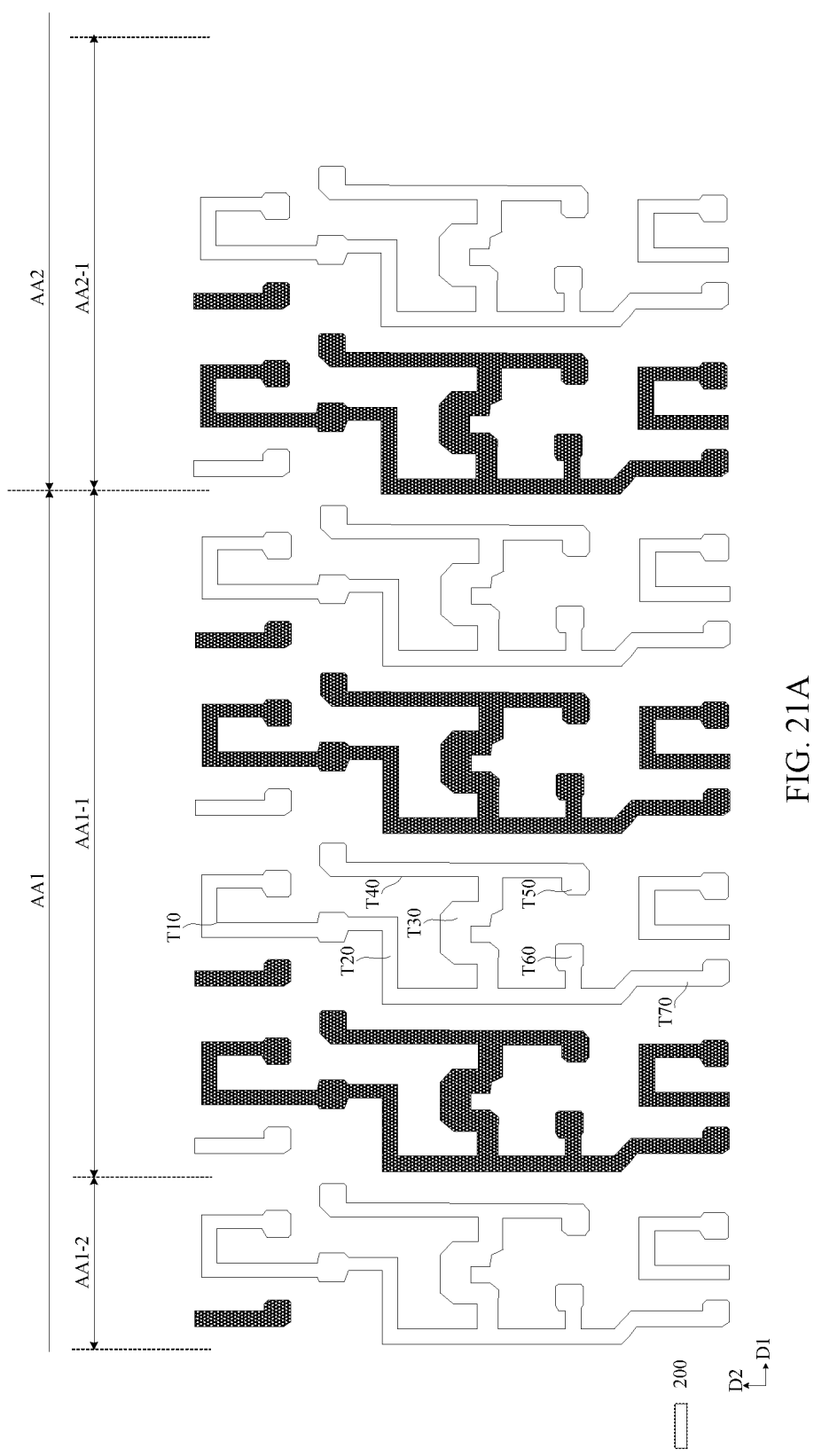
FIG. 21A is a schematic top view of a display panel after a semiconductor layer is formed in FIG. 19.
Figure 21B:
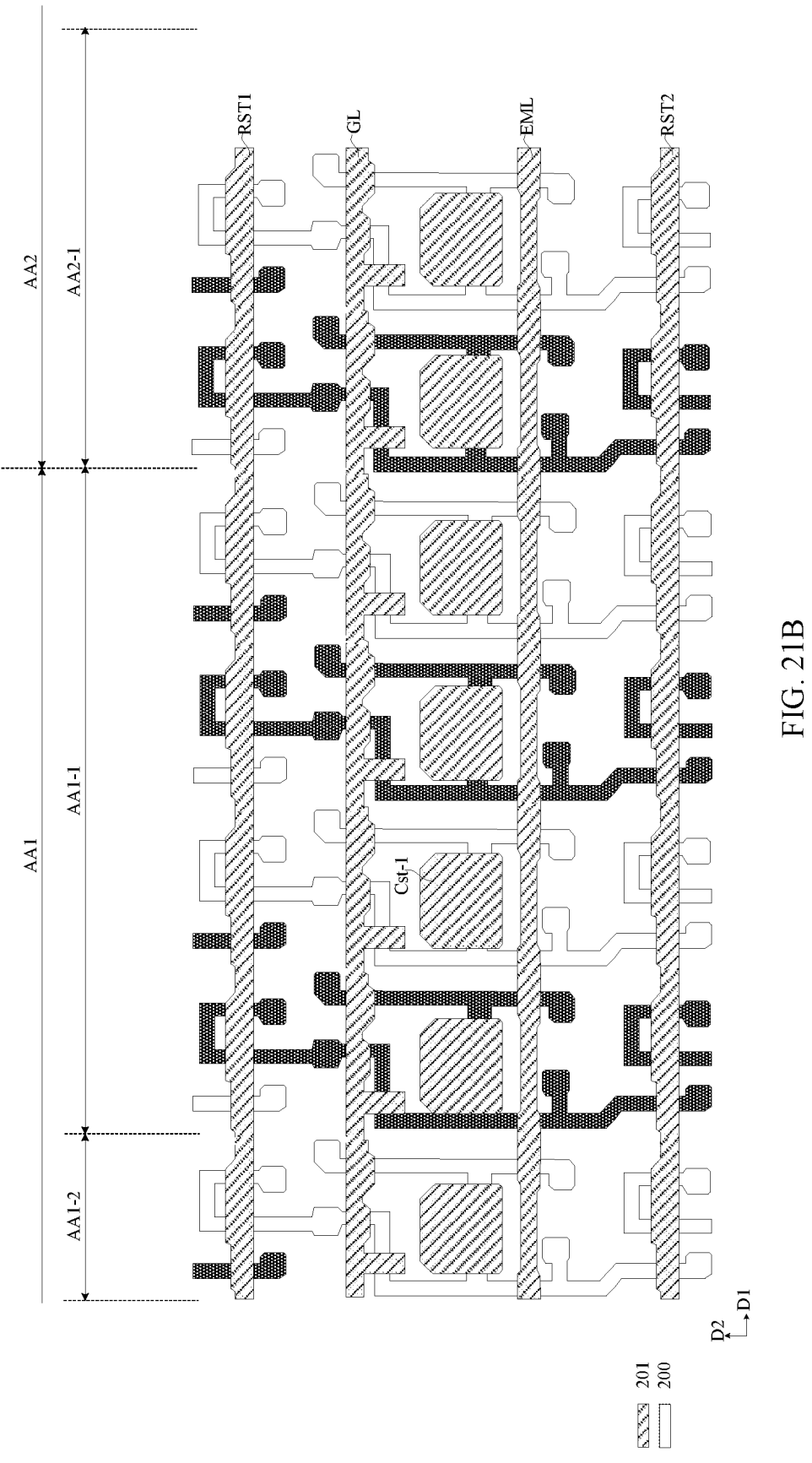
FIG. 21B is a schematic top view of a display panel after a first gate metal layer is formed in FIG. 19.
Figure 21C:
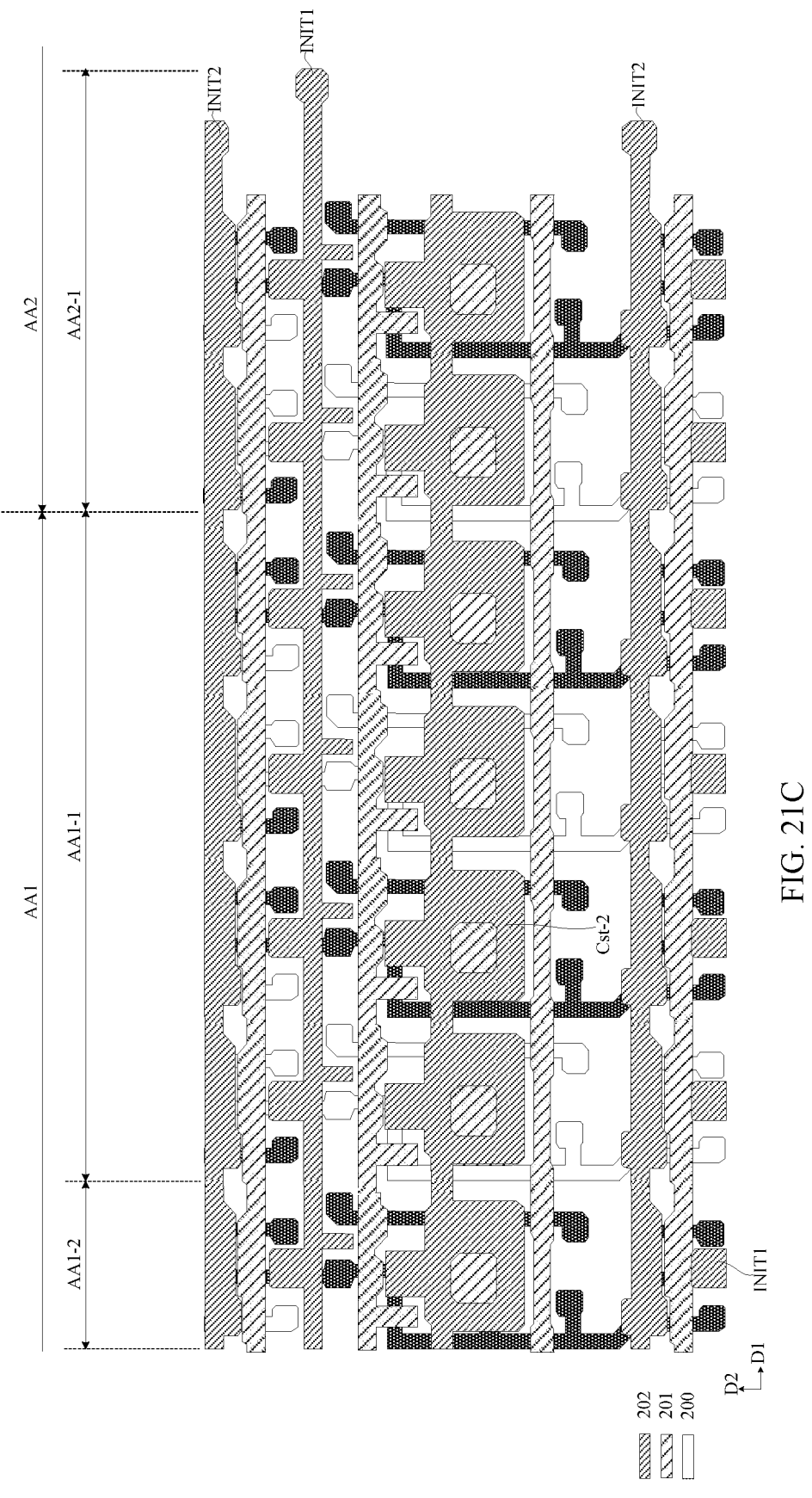
FIG. 21C is a schematic top view of a display panel after a second gate metal layer is formed in FIG. 19.
Figure 21D:
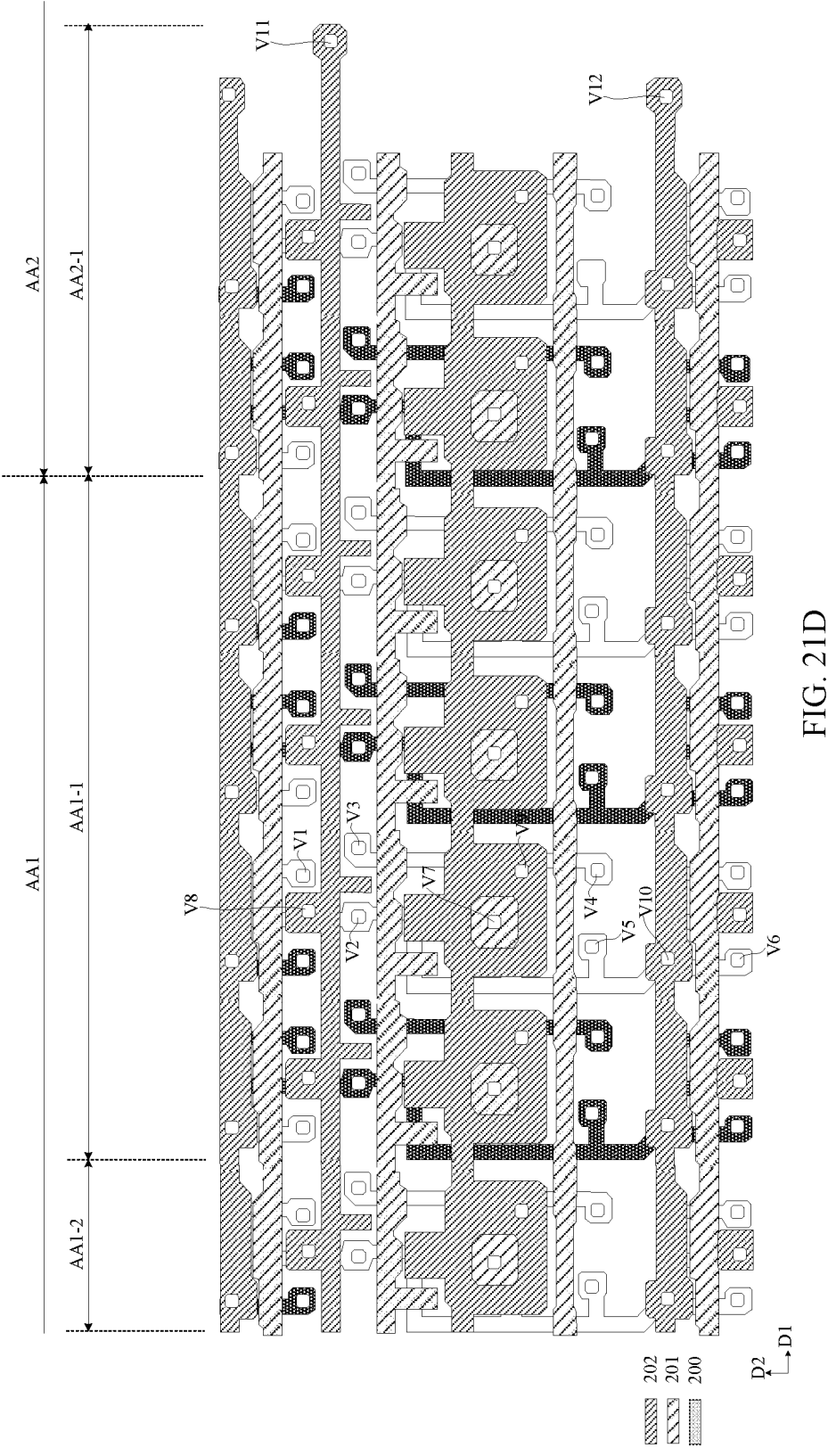
FIG. 21D is a schematic top view of a display panel after a third insulating layer is formed in FIG. 19.
Figure 21E:
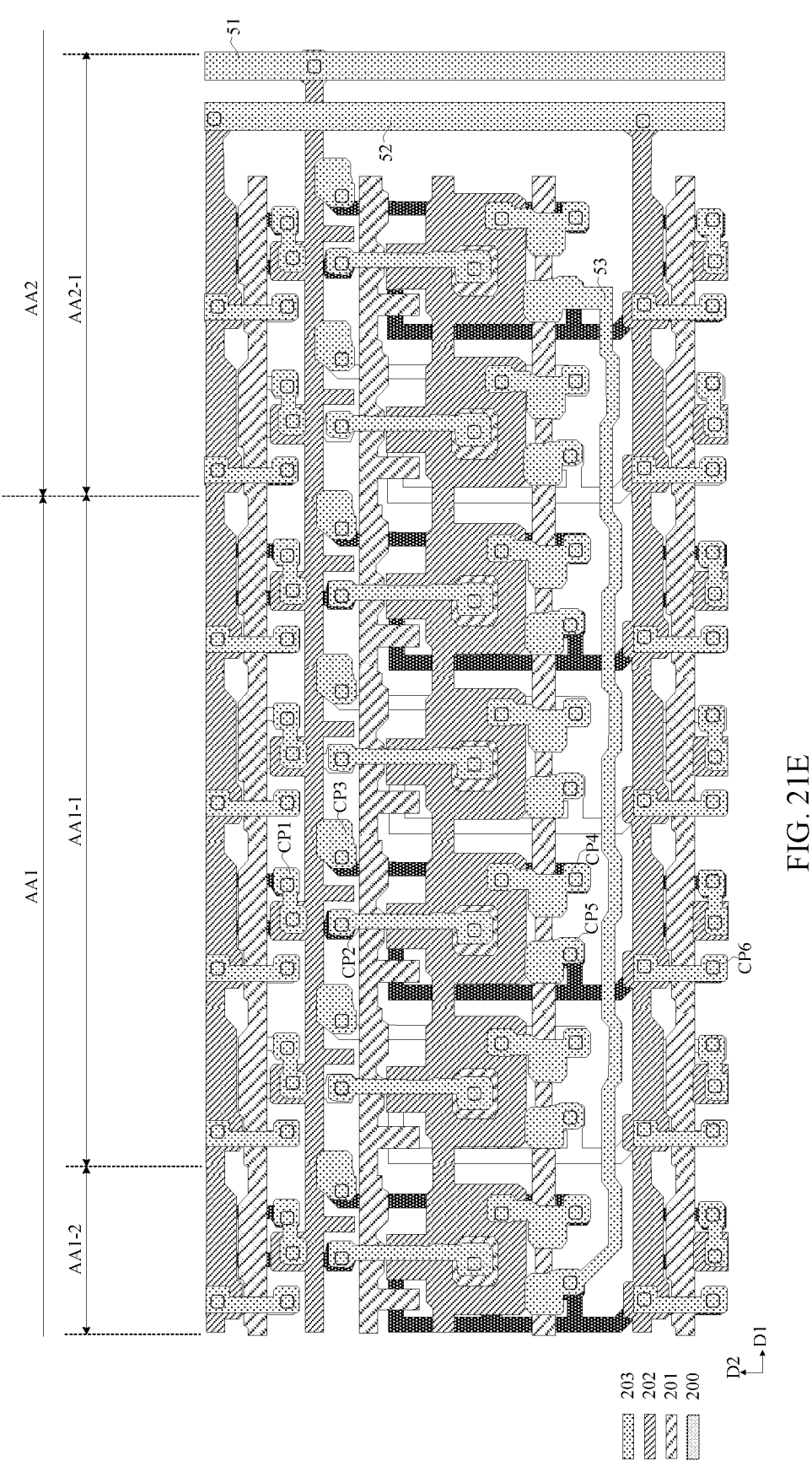
FIG. 21E is a schematic top view of a display panel after a first source-drain metal layer is formed in FIG. 19.

FIG. 19 is a schematic top view of a circuit structure layer in region S3 in FIG. 18. FIG. 20 is a partial sectional view along a U-U' direction in FIG. 19. FIG. 21A is a schematic top view of a display panel after a semiconductor layer is formed in FIG. 19. FIG. 21B is a schematic top view of the display panel after a first gate metal layer is formed in FIG. 19. FIG. 21C is a schematic top view of a display panel after a second gate metal layer is formed in FIG. 19. FIG. 21D is a schematic top view of a display panel after a third insulating layer is formed in FIG. 19. FIG. 21E is a schematic top view of a display panel after a first source-drain metal layer is formed in FIG. 19.

In some examples, as shown in FIGS. 19 and 20, the circuit structure layer 20 of the transition region AA2-1 of the first region AA1 and the second region AA2 may include a semiconductor layer 200, a first insulating layer 211, a first gate metal layer 201, a second insulating layer 212, a second gate metal layer 202, a third insulating layer 213, a first source-drain metal layer 203, a fourth insulating layer 214, a second source-drain metal layer 204, and a fifth insulating layer 215 that are sequentially disposed on a base substrate 310. The circuit structure layer 20 in a light-transmissive region of the second region AA2 may include: a first insulating layer 211, a second insulating layer 212, a third insulating layer 213, a fourth insulating layer 214 and a fifth insulating layer 215, which are sequentially stacked on the base substrate 310. In some examples, the first to fourth insulating layers 211 to 214 may be inorganic material layers and the fifth insulating layer 215 may be an organic material layer; alternatively, the first to third insulating layers 211 to 213 may be inorganic material layers and the fourth and fifth insulating layers 214 and 215 may be organic material layers. However, this embodiment is not limited thereto.

In some examples, as shown in FIG. 19, the first region AA1 may include: a first circuit region AA1-1 and a second circuit region AA1-2. The first circuit region AA1-1 may include multiple first pixel drive circuits, and the second circuit region AA1-2 may include multiple second pixel drive circuits, or multiple second pixel drive circuits and invalid pixel drive circuits. In this example, four first pixel drive circuits in the first circuit region AA1-1 and one second pixel drive circuit in the second circuit region AA1-2 are illustrated as an example. The transition region AA2-1 is illustrated by two invalid pixel drive circuits.

A structure of the display panel will now be described through an example of a manufacturing process of the display panel. The "patterning process" mentioned in the embodiments of the present disclosure includes processes, such as photoresist coating, mask exposure, development, etching and photoresist stripping for metal materials, inorganic materials or transparent conductive materials, and includes organic material coating, mask exposure and development for organic materials. The deposition may be any one or more of sputtering, evaporation, and chemical vapor deposition. The coating may be any one or more of spray coating, spin coating, and ink-jet printing. The etching may be any one or more of dry etching and wet etching, which is not limited in present disclosure. A "thin film" refers to a layer of thin film made of a material on a base substrate by using deposition, coating, or another process. If the "thin film" does not need a patterning process in an entire manufacturing process, the "thin film" may also be called a "layer". If the "thin film" needs a patterning process in an entire manufacturing process, it is called a "thin film" before the patterning process, and called a "layer" after the patterning process. The "layer" after the patterning process includes at least one "pattern".

In some exemplary embodiments, a manufacturing process of a display panel may include following operations. Among them, an equivalent circuit of a pixel drive circuit of the first region AA1 may be as shown in FIG. 3. The structure of the first pixel drive circuit will be described as an example and the structure of a second pixel drive circuit is similar to that of an invalid pixel drive circuit.

(1) A base substrate is provided.

In some exemplary embodiments, the base substrate 310 may be a flexible substrate, or may be a rigid substrate such as a glass substrate. However, this embodiment is not limited thereto.

(2) A semiconductor layer 200 is formed.

In some exemplary embodiments, a semiconductor thin film is deposited on the base substrate 310 of the first region AA1 and the transition region AA2-1, the semiconductor thin film is patterned through a patterning process, and the semiconductor layer 200 is formed in the first region AA1 and the transition region AA2-1. As shown in FIG. 19 and FIG. 21A, the semiconductor layer 200 may include: active layers of multiple transistors of the pixel drive circuit (for example, including: an active layer T10 of the first reset transistor T1 of the pixel drive circuit, an active layer T20 of a threshold compensation transistor T2, an active layer T30 of a drive transistor T3, an active layer T40 of a data writing transistor T4, an active layer T50 of a first light emitting control transistor T5, an active layer T60 of a second light emitting control transistor T6, and an active layer T70 of a second reset transistor T7. The active layers of the seven transistors of one pixel drive circuit may be interconnected as an integral structure.

In exemplary embodiments, a material of the semiconductor layer 200 may include, for example, polysilicon. An active layer may include at least one channel region and a first region and a second region located on two ends of the channel region. The channel region may not be doped with an impurity, and has characteristics of a semiconductor. The first region and the second region may be arranged on two sides of the channel region and doped with impurities, and thus are conductive. The impurities may be changed according to a type of a transistor. In some examples, a doped region of the active layer may be interpreted as a source or a drain of a transistor. A part of the active layer between the transistors may be interpreted as a wiring doped with an impurity, and may be used for electrically connection with the transistors.

(3) A first gate metal layer is formed.

In some exemplary embodiments, a first insulating thin film and a first metal thin film are sequentially deposited on the base substrate 310 on which the aforementioned structures are formed, and the first metal thin film is patterned through a patterning process to form a first insulating layer 211 covering the semiconductor layer 200, and a first gate metal layer 201 disposed on the first insulating layer 211 of the first region AA1 and the transition region AA2-1. As shown in FIGS. 19 and 21B, the first gate metal layer 201 may include gates of multiple transistors of the pixel drive circuit, and a first capacitor plate Cst-1 of a storage capacitor Cst, a first reset control line RST1, a second reset control line RST2, a scan line GL, and a light emitting control line EML. The first reset control line RST1 and the gate of the first reset transistor T1 of the pixel drive circuit in a same row may be in an integral structure. The scan line GL and the gate of the data writing transistor T4 and the gate of the threshold compensation transistor T2 of the pixel drive circuit in the same row may be in an integral structure. The gate of the drive transistor T3 of the same pixel drive circuit and the first capacitor plate Cst-1 of the storage capacitor Cst may be in an integral structure. The light emitting control line EML and the gate of the first light emitting control transistor T5 and the gate of the second light emitting control transistor T61 of the pixel drive circuit in the same row may be in an integral structure. The second reset control line RST2 and the gate of the second reset transistor T7 of the pixel drive circuit in the same row may be in an integral structure.

(4) A second gate metal layer is formed.

In some exemplary embodiments, a second insulating thin film and a second metal thin film are deposited in sequence on the base substrate 310 on which the aforementioned structures are formed, the second metal thin film is patterned through a patterning process to form a second insulating layer 212 covering the first gate metal layer 201 and a second gate metal layer 202 disposed on the second insulating layer 212 of the first region AA1 and the transition region AA2-1. As shown in FIGS. 19 and 21C, the second gate metal layer 202 may include a second capacitor plate Cst-2 of the storage capacitor Cst of the pixel drive circuit, a first initial signal line INIT1, and a second initial signal line INIT2. At least one of first initial signal line INIT1 and a second initial signal line INIT2 may extend in the first direction D1 to the transition region AA2-1.

(5) A third insulating layer and a first source-drain metal layer are formed.

In some exemplary embodiments, a third insulating thin film is deposited on the base substrate 310 on which the aforementioned structures are formed, and the third insulating layer 213 is formed through a patterning process. The third insulating layer 213 is provided with multiple pixel via holes. Subsequently, a third metal thin film is deposited and patterned through a patterning process to form a first source-drain metal layer 203 disposed on the third insulating layer 213 of the first region AA1 and the transition region AA2-1.

In some examples, as shown in FIG. 19 and FIG. 21D, the third insulating layer 213 of a first circuit region AA1-1 of the first region AA1 may be provided with multiple pixel via holes, for example, the first pixel via hole V1 to the tenth pixel via hole V10 may be included. The third insulating layer 213, the second insulating layer 212, and the first insulating layer 211 in the first pixel via hole V1 to the sixth pixel via hole V6 are removed to expose a surface of the semiconductor layer 200. The third insulating layer 213 and the second insulating layer 212 in the seventh pixel via hole V7 are removed to expose a surface of the first gate metal layer 201. The third insulating layer 213 in the eighth pixel via hole V8 to the tenth pixel via hole V10 is removed to expose a surface of the second gate metal layer 202. The third insulating layer 213 in the transition region AA2-1 may also be provided with multiple eleventh pixel via hole V11 and twelfth pixel via holes V12. The third insulating layer 213 in the eleventh pixel via holes V11 is removed to expose a surface of the first initial signal line INIT1, and the third insulating layer 213 in the twelfth pixel via holes V12 is removed to expose a surface of the second initial signal line INIT2.

In some examples, as shown in FIGS. 19 and 21E, the first source-drain metal layer 203 of the first circuit region AA1-1 of the first region AA1 may include a data line DL, a first power supply line PL1, and multiple connection electrodes (for example, a first connection electrode CP1 to a sixth connection electrode CP6). The first connection electrode CP1 may be electrically connected to the first region of the active layer T10 of the first reset transistor T1 through the first pixel via hole V1, and may also be electrically connected to the first initial signal line INIT1 through the eighth pixel via hole V8. The second connection electrode CP2 may be electrically connected to the gate of the drive transistor T3 through the seventh pixel via hole V7, and may also be electrically connected to the first region of the active layer T20 of the threshold compensation transistor T2 through the second pixel via hole V2. The third connection electrode CP3 may be electrically connected to the first region of the active layer T40 of the data writing transistor T4 through the third pixel via hole V3. The fourth connection electrode CP4 may be electrically connected to the first region of the active layer T50 of the first light emitting control transistor T5 through the fourth pixel via hole V4, and may also be electrically connected to the second capacitor plate Cst-2 of the storage capacitor Cst through the ninth pixel via hole V9. The fifth connection electrode CP5 may be electrically connected to the second region of the active layer T60 of the second light emitting control transistor T6 through the fifth pixel via hole V5. The sixth connection electrode CP6 may be electrically connected to the first region of the active layer T70 of the second reset control transistor T7 through the sixth pixel via hole V6, and may also be electrically connected to the second initial signal line INIT2 through the tenth pixel via hole V10.

In some examples, the first source-drain metal layer 203 of the transition region AA2-1 may include a first connection line 51 and a second connection line 52. The first connection line 51 may be located on a side of the second connection line 52 away from the first region AA1. The first connection line 51 may be electrically connected to the first initial signal line INIT1 through the eleventh pixel via hole V11. The second connection line 52 may be electrically connected to the second initial signal line INIT2 through the twelfth pixel via hole V12. This example achieves transmission of the first initial signal and the second initial signal in the regions on two sides of the second region in the first direction D1 by arranging the first connection line and the second connection line around the second region.

In some examples, the first source-drain metal layer 203 of the transition region AA2-1 may further include a third connection line 53. The third connection line 53 may extend from the transition region AA2-1 to the second circuit region AA1-2 of the first region AA1 in the first direction D1. In this example, the second light emitting device in the transition region AA2-1 may be electrically connected to a second pixel drive circuit of the first region AA1 (e.g. a second pixel drive circuit in the first region AA1 closest to the second region AA2) through the third connection line 53. As shown in FIG. 21E, one end of the third connection line 53 and a fifth connection electrode of an invalid pixel drive circuit in the transition region AA2-1 may be in an integral structure, and the other end of the third connection line 53 and a fifth connection electrode of a second pixel drive circuit in the second circuit region AA1-2 may be in an integral structure. The fifth connection electrode of the invalid pixel circuit may not be electrically connected to the semiconductor layer. In this example, the second light emitting device in the transition region AA2-1 is electrically connected to the second pixel drive circuit through the wirings located in the first source-drain metal layer, which is conducive to reducing conductive lines of the transparent conductive layer, so that the conductive lines of the transparent conductive layer may be reasonably arranged, which avoids too many conductive lines from affecting arrangement of wirings.

(6) A second source-drain metal layer is formed.

In some exemplary embodiments, on the base substrate 310 on which the aforementioned structures are formed, a fourth metal thin film is deposited, and the fourth metal thin film is patterned through a patterning process to form a second source-drain metal layer 204 disposed on the fourth insulating layer 214 of the first region AA and the transition region AA2-1. In some examples, as shown in FIG. 19, the second source-drain metal layer 204 may include a data line DL, a first power supply line PL1, and a connection electrode (e.g. a seventh connection electrode CP7). The seventh connection electrode CP7 in the first circuit region AA1-1 may be electrically connected to the fifth connection electrode CP5 through a fifteenth via hole V15 formed in the fourth insulating layer 214, and the subsequent seventh connection electrode CP7 may be electrically connected to an anode of a first light emitting device through switching by an anode connection electrode. The seventh connection electrode CP7 in the second circuit region AA1-2 may not be electrically connected to the fifth connection electrode of the second pixel drive circuit. The seventh connection electrode in the transition region AA2-1 may not be electrically connected to the invalid pixel drive circuit, but may be electrically connected to the third connection line 53 so as to be subsequently electrically connected to the anode of the second light emitting device, so that the second pixel drive circuit and the anode of the second light emitting device are electrically connected through the third connection line 53.

In some exemplary embodiments, a fifth insulating thin film is coated on the base substrate 310 on which the aforementioned structures are formed, and a fifth insulating layer 215 is formed through a patterning process.

At this point, the manufacturing of the circuit structure layer 20 has been completed. The light-transmissive region of the second region AA2 may include: the base substrate 310, and the first insulating layer 211, the second insulating layer 212, the third insulating layer 213, the fourth insulating layer 214 and the fifth insulating layer 215 which are stacked on the base substrate 310.

(7) A first transparent conductive layer is formed.

In some exemplary embodiments, a first transparent conductive thin film is deposited on the base substrate 310 on which the aforementioned structures are formed, and the first transparent conductive thin film is patterned through a patterning process to form a first transparent conductive layer 330 disposed on the fifth insulating layer 215, as shown in FIGS. 15A and 15B.

(8) A first planarization layer and a second transparent conductive layer are formed.

In some exemplary embodiments, a first planarization thin film is coated on the base substrate 310 on which the aforementioned structures are formed, and the first planarization layer 21 is formed through a patterning process. Subsequently, a second transparent conductive thin film is deposited and patterned through a patterning process to form a second transparent conductive layer 340 disposed on the first planarization layer 21, as shown in FIGS. 16A and 16B.

(9) A second planarization layer and a third transparent conductive layer are formed.

In some exemplary embodiments, a second planarization thin film is coated on the base substrate 310 on which the aforementioned structures are formed, and the second planarization layer 22 is formed through a patterning process. Subsequently, a third transparent conductive thin film is deposited and patterned through a patterning process to form a third transparent conductive layer 350 disposed on the second planarization layer 22, as shown in FIGS. 17A and 17B.

(10) A light emitting structure layer is formed.

In some exemplary embodiments, a third planarization thin film is coated on the base substrate 310 on which the aforementioned structures are formed, and the third planarization layer 23 is formed through a patterning process. Subsequently, an anode conductive thin film is deposited, and the anode conductive thin film is patterned through a patterning process to form an anode layer 41 disposed on the third planarization layer 23. Subsequently, a pixel define thin film is coated on the base substrate on which the aforementioned patterns are formed, and a pixel define layer (PDL) is formed by masking, exposure and development processes. The pixel define layer is provided with multiple pixel openings exposing the anode layer. An organic light emitting layer is formed in the aforementioned pixel openings, and the organic light emitting layer is connected to an anode. Then, a cathode thin film is deposited and patterned through a patterning process to form a pattern of a cathode. The cathode is electrically connected to the organic light emitting layer and the second power supply line respectively. Then, an encapsulation layer is formed on the cathode. The encapsulation layer may include a stacked structure of an inorganic material/an organic material/an inorganic material.

In some exemplary implementations, the first gate metal layer 201, the second gate metal layer 202, the first source-drain metal layer 203 and the second source-drain metal layer 204 may be made of metal materials such as any one or more of silver (Ag), copper (Cu), aluminum (Al) and molybdenum (Mo), or an alloy of the above metals such as aluminum-neodymium (AlNd) or molybdenum-niobium (MoNb), and may be in a single-layer structure, or a multi-layer composite structure such as Mo/Cu/Mo, etc. The first to third transparent conductive layers 330 to 350 may be made of a transparent conductive material such as indium tin oxide (ITO). The first insulating layer 211, the second insulating layer 212, the third insulating layer 213, and the fourth insulating layer 214 may be made of any one or more of Silicon Oxide (SiOx), Silicon Nitride (SiNx), and Silicon Oxynitride (SiON), and may be a single layer, a multi-layer, or a composite layer. The fifth insulating layer 215, the first planarization layer 21 to the third planarization layer 23 may be made of organic materials such as polyimide, acrylic or polyethylene terephthalate. The pixel definition layer may be made of an organic material, such as polyimide, acrylic, or polyethylene terephthalate. The anode layer 41 may be made of a reflective material such as a metal, and the cathode may be made of a transparent conductive material. However, this embodiment is not limited thereto.

The structure and the manufacturing process of the display panel of this embodiment are merely illustrative. In some exemplary embodiments, a corresponding structure may be changed and a patterning process may be added or reduced according to actual needs. The manufacturing process of this exemplary embodiment may be implemented using an existing mature manufacturing device, and may be compatible well with an existing manufacturing process, simple in process implementation, easy to implement, high in a production efficiency, low in production cost, and high in yield rate.

In some other exemplary embodiments, there may be an overlap between portions of the conductive lines of the second transparent conductive layer and the third transparent conductive layer extending along the first direction. An orthographic projection of a portion of a conductive line of a first transparent conductive layer extending along the first direction on the base substrate may not overlap with an orthographic projection of a portion of conductive lines of the other two conductive layers extending along the first direction on the base substrate. For example, a first type second light emitting device in a first sub-region of the second region may be electrically connected to a second pixel drive circuit through a first transparent conductive line of the first transparent conductive layer, and a second type second light emitting device may be electrically connected to the second pixel drive circuit through a second transparent conductive line of the second transparent conductive layer. As another example, the first type second light emitting device in the first sub-region may be electrically connected to the second pixel drive circuit through the second transparent conductive line of the second transparent conductive layer, and the second type second light emitting device may be electrically connected to the second pixel drive circuit through the first transparent conductive line of the first transparent conductive layer.

In some other exemplary embodiments, there may be an overlap between portions of conductive lines of the first transparent conductive layer and the third transparent conductive layer extending along the first direction. An orthographic projection of a portion of a conductive line of the second transparent conductive layer extending along the first direction on the base substrate may not overlap with an orthographic projection of a portion of conductive lines of the other two conductive layers extending along the first direction on the base substrate. For example, a first type second light emitting device in the first sub-region of the second region may be electrically connected to the second pixel drive circuit through the first transparent conductive line of the first transparent conductive layer, and a second type second light emitting device may be electrically connected to the second pixel drive circuit through the second transparent conductive line of the second transparent conductive layer. As another example, the first type second light emitting device in the first sub-region may be electrically connected to the second pixel drive circuit through the second transparent conductive line of the second transparent conductive layer, and the second type second light emitting device may be electrically connected to the second pixel drive circuit through the first transparent conductive line of the first transparent conductive layer.

In some other exemplary embodiments, the display panel may include four or more transparent conductive layers. Transparent conductive lines to which the first type second light emitting device and the second type second light emitting device are electrically connected to in the first sub-region of the second region may be located in two different transparent conductive layers, and at least one transparent conductive layer may be spaced between the two different transparent conductive layers.

According to the display panel provided by the embodiment, by adjusting the film layers of the transparent conductive lines electrically connected to the first type second light emitting device and the second type second light emitting device in the first region, the crosstalk between the first type second light emitting device and the second type second light emitting device is reduced, thereby improving the display uniformity of the second region and improving the display effect of the second region.

At least one embodiment of the present disclosure further provides a display device including the display panel as described above.

The drawings of the present disclosure only involve structures involved in the present disclosure, and other structures may refer to conventional designs. The embodiments in the present disclosure, i.e., features in the embodiments, may be combined with each other to obtain new embodiments if there is no conflict. Those of ordinary skills in the art should understand that modifications or equivalent replacements of the technical solutions of the present disclosure may be made without departing from the spirit and scope of the technical solutions of the present disclosure, and shall all fall within the scope of the claims of the present disclosure.

The invention claimed is:

1. A display panel having a display area, the display area comprises: a first region and a second region which are not overlapped with each other, the first region is located on at least one side of the second region;

the display panel comprises:

a base substrate;

a circuit structure layer located on a side of the base substrate and comprising a plurality of second pixel drive circuits located in the first region;

a light emitting structure layer located on a side of the circuit structure layer away from the base substrate and comprising a plurality of second light emitting devices located in the second region;

a plurality of conductive layers located between the circuit structure layer and the light emitting structure layer and comprising a plurality of conductive lines; wherein at least one second pixel drive circuit of the plurality of second pixel drive circuits is electrically connected to at least one second light emitting device of the plurality of second light emitting devices through a conductive line of at least one conductive layer of the plurality of conductive layers, the at least one second pixel drive circuit is configured to drive the at least one second light emitting device to emit light; and orthographic projections of portions of conductive lines of at least two of the plurality of conductive layers extending in a first direction on the base substrate are overlapped, wherein the plurality of second light emitting devices in the second region comprise: a plurality of first type second light emitting devices and a plurality of second type second light emitting devices, the first type second light emitting devices are configured to emit light of a first color and the second type second light emitting devices are configured to emit light of a second color, and the second color is different from the first color, wherein the plurality of second light emitting devices in the second region comprises a plurality of sets of second light emitting devices, second light emitting devices in each of the plurality of sets of second light emitting devices are arranged along the first direction, the plurality of sets of second light emitting devices are arranged along a second direction, wherein the second direction intersects with the first direction;

in at least one set of second light emitting devices, a plurality of second pixel drive circuits electrically connected to the plurality of first type second light emitting devices are closer to the second region than each of a plurality of second pixel drive circuits electrically connected to the plurality of second type second light emitting devices.

2. The display panel according to claim 1, wherein the plurality of conductive layers comprise: a first transparent conductive layer, a second transparent conductive layer, and a third transparent conductive layer arranged in sequence on a side away from the base substrate;

the first transparent conductive layer comprises a plurality of first transparent conductive lines, the second transparent conductive layer comprises a plurality of second transparent conductive lines, and the third transparent conductive layer comprises a plurality of third transparent conductive lines;

an orthographic projection of a portion of a first transparent conductive line of the first transparent conductive layer extending in the first direction on the base substrate is overlapped with an orthographic projection of a portion of a second transparent conductive line of the second transparent conductive layer extending in the first direction on the base substrate; and an orthographic projection of a portion of a third transparent conductive line of the third transparent conductive layer extending in the first direction on the base substrate is overlapped with an orthographic projection of a portion of a first transparent conductive line of the first transparent conductive layer and a portion of a second transparent conductive line of the second transparent conductive layer extending in the first direction on the base substrate.

3. The display panel according to claim 2, wherein in at least one set of second light emitting devices in the second region, a plurality of first type second light emitting devices near an edge of the second region are electrically connected to a plurality of second pixel drive circuits of the first region through a second transparent conductive line of the second transparent conductive layer, a plurality of first type second light emitting devices near a center of the second region are electrically connected to a plurality of second pixel drive circuits of the first region through a first transparent conductive line of the first transparent conductive layer.

4. The display panel according to claim 3, wherein in the at least one set of second light emitting devices in the second region, the second transparent conductive line and the first transparent conductive line to which the plurality of first type second light emitting devices are electrically connected are located on opposite sides or on a same side of the set of second light emitting devices in the second direction.

5. The display panel according to claim 3, wherein in the at least one set of second light emitting devices in the second region, a plurality of second type second light emitting devices near an edge of the second region are electrically connected to a plurality of second pixel drive circuits of the first region through a second transparent conductive line of the second transparent conductive layer, a plurality of second type second light emitting devices near the center of the second region are electrically connected to a plurality of second pixel drive circuits of the first region through a third transparent conductive line of the third transparent conductive layer.

6. The display panel according to claim 5, wherein in the at least one set of second light emitting devices in the second region, the second transparent conductive line and the third transparent conductive line to which the plurality of second type second light emitting devices are electrically connected are located on opposite sides or on a same side of the set of second light emitting devices in the second direction.

7. The display panel according to claim 5, wherein in the at least one set of second light emitting devices in the second region, the second transparent conductive line electrically connected to the first type second light emitting devices and the second transparent conductive line electrically connected to the second type second light emitting devices are located on opposite sides of the set of second light emitting devices in the second direction.

8. The display panel according to claim 5, wherein in the at least one set of second light emitting devices in the second region, a first transparent conductive line electrically connected to the first type second light emitting devices and a third transparent conductive line electrically connected to the second type second light emitting devices are located on a same side of the set of second light emitting devices in the second direction.

9. The display panel according to claim 2, wherein in at least one set of second light emitting devices in the second region, a plurality of first type second light emitting devices near an edge of the second region are electrically connected to a plurality of second pixel drive circuits of the first region through a first transparent conductive line of the first transparent conductive layer, a plurality of first type second light emitting devices near a center of the second region are electrically connected to a plurality of second pixel drive circuits of the first region through a second transparent conductive line of the second transparent conductive layer; and the first transparent conductive line and the second transparent conductive line electrically connected to the first type second light emitting devices are located on a same side of the set of second light emitting devices in the second direction.

10. The display panel according to claim 9, wherein in the at least one set of second light emitting devices in the second region, a plurality of second type second light emitting devices near an edge of the second region are electrically connected to a plurality of second pixel drive circuits of the first region through a second transparent conductive line of the second transparent conductive layer, a plurality of second type second light emitting devices near the center of the second region are electrically connected to a plurality of second pixel drive circuits of the first region through a third transparent conductive line of the third transparent conductive layer; and the second transparent conductive line electrically connected to the second type second light emitting devices and the second transparent conductive line electrically connected to the first type second light emitting devices are located on opposite sides of the set of second light emitting devices in the second direction.

11. The display panel according to claim 1, wherein the second region is divided into a first sub-region and a second sub-region, the second sub-region surrounds the first sub-region and is adjacent to the first region; and a parasitic capacitance between an anode connection node of at least one first type second light emitting device and an anode connection node of a second type second light emitting device located in the first sub-region is less than or equal to a maximum parasitic capacitance between an anode connection node of a first type second light emitting device and an anode connection node of a second type second light emitting device located in the second sub-region.

12. The display panel according to claim 1, wherein the light of the first color is green light and the light of the second color comprises at least one of: blue light, red light.

13. The display panel according to claim 1, wherein the circuit structure layer further comprises: a plurality of first pixel drive circuits located in the first region, and the light emitting structure layer further comprises: a plurality of first light emitting devices located in the first region; and at least one first pixel drive circuit of the plurality of first pixel drive circuits is electrically connected to at least one first light emitting device of the plurality of first light emitting devices, and the at least one first pixel drive circuit is configured to drive the at least one first light emitting device to emit light.

14. A display device, comprising the display panel according to claim 1.

15. The display device according to claim 14, further comprising: a sensor located on a non-display side of the display panel, and an orthographic projection of the sensor on the display panel overlaps with the second region of the display panel.

16. The display panel according to claim 4, wherein in the at least one set of second light emitting devices in the second region, a plurality of second type second light emitting devices near an edge of the second region are electrically connected to a plurality of second pixel drive circuits of the first region through a second transparent conductive line of the second transparent conductive layer, a plurality of second type second light emitting devices near the center of the second region are electrically connected to a plurality of second pixel drive circuits of the first region through a third transparent conductive line of the third transparent conductive layer.

17. The display panel according to claim 6, wherein in the at least one set of second light emitting devices in the second region, the second transparent conductive line electrically connected to the first type second light emitting devices and the second transparent conductive line electrically connected to the second type second light emitting devices are located on opposite sides of the set of second light emitting devices in the second direction.

* * * * *